(12) United States Patent
Hansell et al.

(10) Patent No.: US 10,749,571 B2
(45) Date of Patent: Aug. 18, 2020

(54) SYSTEM AND METHODS FOR INFERRING THE FEEDER AND PHASE POWERING AN ON-GRID TRANSMITTER

(71) Applicants: ASTROLINK INTERNATIONAL LLC, Bethesda, MD (US);
DOMINION ENERGY TECHNOLOGIES, INC., Richmond, VA (US)

(72) Inventors: Jerritt H. Hansell, Boulder, CO (US);
Henrik F. Bernheim, Denver, CO (US)

(73) Assignee: TRC Companies, Inc., Windsor, CT (US)

( * ) Notice: Subject to any disclaimer, the term of this patent is extended or adjusted under 35 U.S.C. 154(b) by 194 days.

(21) Appl. No.: 14/304,648

(22) Filed: Jun. 13, 2014

(65) Prior Publication Data

US 2015/0010093 A1 Jan. 8, 2015

Related U.S. Application Data

(60) Provisional application No. 61/834,573, filed on Jun. 13, 2013.

(51) Int. Cl.
*H04B 3/54* (2006.01)
*G01R 21/00* (2006.01)
*G01R 29/18* (2006.01)

(52) U.S. Cl.
CPC .............. *H04B 3/54* (2013.01); *G01R 21/00* (2013.01); *G01R 29/18* (2013.01); *H04B 2203/5458* (2013.01); *H04B 2203/5466* (2013.01)

(58) Field of Classification Search
CPC ............... H04B 3/54; H04B 2203/542; H04B 2203/5466; H04B 2203/5458

USPC ...................................................... 340/12.32
See application file for complete search history.

(56) References Cited

U.S. PATENT DOCUMENTS

| | | | |
|---|---|---|---|
| 3,733,586 A | 5/1973 | Lusk et al. | |
| 3,911,415 A | 10/1975 | Whyte | |
| 3,942,170 A | 3/1976 | Whyte | |
| 3,944,723 A | 3/1976 | Fong | |
| 4,200,770 A | 4/1980 | Hellman et al. | |
| 4,361,766 A | 11/1982 | de Montgolfier et al. | |

(Continued)

FOREIGN PATENT DOCUMENTS

| | | |
|---|---|---|
| CN | 101770007 | 7/2010 |
| EP | 0395495 A1 | 10/1990 |

(Continued)

OTHER PUBLICATIONS

International Preliminary Report on Patentability for PCT/US2014/041396, dated Dec. 17, 2015, 8 pages.

(Continued)

*Primary Examiner* — Vernal U Brown
(74) *Attorney, Agent, or Firm* — Withrow & Terranova, PLLC

(57) ABSTRACT

A system and method for inferring the feeder and phase of a transmitter on a plurality of electrical distribution lines. The system may include a low-voltage electrical distribution grid having one or more phases and one or more lines, a mechanism for transmitting a measuring data, a mechanism for receiving the measuring data, and a mechanism that analyzes the transmitted data to infer the phase and feed on which the transmission is injected.

19 Claims, 14 Drawing Sheets

(56) References Cited

U.S. PATENT DOCUMENTS

| | | | |
|---|---|---|---|
| 4,371,867 A | 2/1983 | Gander | |
| 4,568,934 A | 2/1986 | Allgood | |
| 4,580,276 A | 4/1986 | Andruzzi, Jr. et al. | |
| 4,633,463 A | 12/1986 | Mack | |
| 4,668,934 A | 5/1987 | Shuey | |
| 4,918,422 A | 4/1990 | Mak | |
| 5,463,624 A | 10/1995 | Hogg et al. | |
| 5,812,557 A * | 9/1998 | Stewart | G01R 31/42 370/252 |
| 5,818,725 A | 10/1998 | McNamara et al. | |
| 5,987,305 A | 11/1999 | Reitberger | |
| 6,144,292 A | 11/2000 | Brown | |
| 6,212,560 B1 | 4/2001 | Fairchild | |
| 6,366,062 B2 | 4/2002 | Baretich et al. | |
| 6,373,399 B1 | 4/2002 | Johnson et al. | |
| 6,535,797 B1 | 3/2003 | Bowles et al. | |
| 6,650,249 B2 | 11/2003 | Meyer et al. | |
| 6,687,110 B2 | 2/2004 | Murray | |
| 6,690,655 B1 | 2/2004 | Miner et al. | |
| 6,747,994 B2 | 6/2004 | Oses et al. | |
| 6,788,702 B1 | 9/2004 | Garcia-Luna-Aceves et al. | |
| 6,961,641 B1 | 11/2005 | Forth et al. | |
| 7,053,756 B2 | 5/2006 | Mollenkopf et al. | |
| 7,058,524 B2 | 6/2006 | Hayes et al. | |
| 7,069,117 B2 | 6/2006 | Wilson et al. | |
| 7,076,378 B1 | 7/2006 | Huebner | |
| 7,188,003 B2 | 3/2007 | Ransom et al. | |
| 7,194,528 B1 | 3/2007 | Davidow | |
| 7,236,765 B2 | 6/2007 | Bonicatto et al. | |
| 7,251,570 B2 | 7/2007 | Hancock et al. | |
| 7,280,931 B1 | 10/2007 | Kim et al. | |
| 7,319,280 B1 | 1/2008 | Landry et al. | |
| 7,323,968 B2 | 1/2008 | Iwamura | |
| 7,369,579 B2 | 5/2008 | Logvinov et al. | |
| 7,412,338 B2 | 8/2008 | Wynans et al. | |
| 7,552,437 B2 | 6/2009 | Di Luoffo et al. | |
| 7,571,028 B2 | 8/2009 | Lapinski et al. | |
| 7,598,844 B2 | 10/2009 | Corcoran et al. | |
| 7,701,330 B2 | 4/2010 | Iwamura | |
| 7,808,128 B1 | 10/2010 | Weber, Jr. et al. | |
| 7,826,538 B1 * | 11/2010 | Weber, Jr. | H04B 3/54 340/10.42 |
| 7,870,600 B2 | 1/2011 | Huotari et al. | |
| 7,873,077 B2 | 1/2011 | Downey et al. | |
| 7,876,717 B2 | 1/2011 | Iwamura | |
| 7,948,255 B2 | 5/2011 | Shim et al. | |
| 8,013,570 B2 | 9/2011 | Baxter et al. | |
| 8,019,483 B2 | 9/2011 | Keefe | |
| 8,050,879 B2 | 11/2011 | Koste et al. | |
| 8,055,896 B2 | 11/2011 | Jin et al. | |
| 8,099,479 B2 | 1/2012 | Saint-Hilaire | |
| 8,207,726 B2 | 6/2012 | Vaswani | |
| 8,626,462 B2 | 1/2014 | Kolwalkar et al. | |
| 8,639,922 B2 | 1/2014 | Phatak | |
| 8,639,992 B2 | 1/2014 | Haufe et al. | |
| 8,711,995 B2 | 4/2014 | Glende | |
| 8,737,555 B2 | 5/2014 | Haug et al. | |
| 8,818,742 B2 | 8/2014 | Ansari | |
| 8,872,667 B2 | 10/2014 | Bhageria et al. | |
| 9,287,933 B2 | 3/2016 | Yu | |
| 9,647,994 B2 | 5/2017 | Bernheim et al. | |
| 9,654,287 B2 | 5/2017 | Zhao et al. | |
| 9,768,613 B2 | 9/2017 | Taft | |
| 9,859,712 B2 | 1/2018 | Nishibayashi et al. | |
| 9,917,442 B2 | 3/2018 | Beauregard et al. | |
| 9,958,925 B2 | 5/2018 | Chapel et al. | |
| 2001/0018561 A1 | 8/2001 | Tanida | |
| 2001/0037378 A1 | 11/2001 | Hirayama | |
| 2001/0055272 A1 | 12/2001 | Matsuno et al. | |
| 2002/0069299 A1 | 6/2002 | Rosener | |
| 2002/0089927 A1 | 7/2002 | Fischer et al. | |
| 2003/0098671 A1 | 5/2003 | Hochgraf | |
| 2003/0151491 A1 | 8/2003 | Martin et al. | |
| 2004/0062267 A1 | 4/2004 | Minami et al. | |
| 2004/0110044 A1 | 6/2004 | McArthur et al. | |
| 2004/0160990 A1 | 8/2004 | Logvinov et al. | |
| 2004/0184406 A1 | 9/2004 | Iwamura | |
| 2004/0218688 A1 | 11/2004 | Santhoff et al. | |
| 2004/0226621 A1 | 11/2004 | Phillips et al. | |
| 2004/0227621 A1 | 11/2004 | Cope et al. | |
| 2005/0005150 A1 | 1/2005 | Ballard | |
| 2005/0017848 A1 | 1/2005 | Flen et al. | |
| 2005/0018766 A1 | 1/2005 | Iwamura | |
| 2005/0043860 A1 | 2/2005 | Petite | |
| 2005/0047379 A1 | 3/2005 | Boyden et al. | |
| 2005/0063422 A1 | 3/2005 | Lazar et al. | |
| 2005/0144437 A1 | 6/2005 | Ransom et al. | |
| 2005/0155033 A1 | 7/2005 | Luoffo et al. | |
| 2005/0207079 A1 | 9/2005 | Tiller et al. | |
| 2005/0253690 A1 | 11/2005 | Crenshaw et al. | |
| 2005/0281326 A1 | 12/2005 | Yu | |
| 2006/0071757 A1 | 4/2006 | Burghard et al. | |
| 2006/0078044 A1 * | 4/2006 | Norrell | H04L 5/0046 375/222 |
| 2006/0091877 A1 | 5/2006 | Robinson et al. | |
| 2006/0097573 A1 | 5/2006 | Gidge et al. | |
| 2006/0152344 A1 | 7/2006 | Mowery et al. | |
| 2006/0259199 A1 | 11/2006 | Gjerde et al. | |
| 2006/0291575 A1 | 12/2006 | Berkman et al. | |
| 2007/0047573 A1 | 3/2007 | Logvinov et al. | |
| 2007/0076650 A1 | 4/2007 | Manjeshwar et al. | |
| 2007/0100506 A1 | 5/2007 | Teichmann | |
| 2007/0101438 A1 | 5/2007 | Govindarajan | |
| 2007/0114987 A1 | 5/2007 | Kagan | |
| 2007/0162550 A1 | 7/2007 | Rosenberg | |
| 2007/0208521 A1 | 9/2007 | Petite et al. | |
| 2007/0211401 A1 | 9/2007 | Mak | |
| 2007/0237181 A1 | 10/2007 | Cho et al. | |
| 2007/0247331 A1 | 10/2007 | Angelis et al. | |
| 2007/0271383 A1 | 11/2007 | Kim et al. | |
| 2007/0297425 A1 | 12/2007 | Chirco et al. | |
| 2008/0040479 A1 | 2/2008 | Bridge et al. | |
| 2008/0057866 A1 | 3/2008 | Schwager et al. | |
| 2008/0077336 A1 | 3/2008 | Fernandes | |
| 2008/0109387 A1 | 5/2008 | Deaver et al. | |
| 2008/0187116 A1 | 8/2008 | Reeves et al. | |
| 2008/0209481 A1 | 8/2008 | Barrett | |
| 2008/0219239 A1 | 9/2008 | Bell et al. | |
| 2008/0273521 A1 | 11/2008 | Shao | |
| 2008/0312851 A1 | 12/2008 | Kagan et al. | |
| 2009/0027061 A1 | 1/2009 | Curt et al. | |
| 2009/0060060 A1 | 3/2009 | Stadelmeier et al. | |
| 2009/0088907 A1 | 4/2009 | Lewis et al. | |
| 2009/0096416 A1 | 4/2009 | Tonegawa et al. | |
| 2009/0125351 A1 | 5/2009 | Davis, Jr. et al. | |
| 2009/0134699 A1 | 5/2009 | Choi et al. | |
| 2009/0187344 A1 | 7/2009 | Brancaccio et al. | |
| 2009/0210197 A1 | 8/2009 | Cleary | |
| 2009/0219932 A1 | 9/2009 | Kobayashi | |
| 2009/0238252 A1 | 9/2009 | Shah et al. | |
| 2009/0240504 A1 | 9/2009 | Pang et al. | |
| 2009/0243838 A1 | 10/2009 | Jones | |
| 2009/0256686 A1 | 10/2009 | Abbot et al. | |
| 2009/0304101 A1 | 12/2009 | LoPorto et al. | |
| 2010/0005273 A1 | 1/2010 | Lee et al. | |
| 2010/0007219 A1 | 1/2010 | de Buda et al. | |
| 2010/0007336 A1 | 1/2010 | de Buda | |
| 2010/0010857 A1 | 1/2010 | Fadell | |
| 2010/0040068 A1 | 2/2010 | Wimmer | |
| 2010/0054349 A1 | 3/2010 | Spencer | |
| 2010/0061433 A1 | 3/2010 | Stadelmeier et al. | |
| 2010/0134089 A1 | 6/2010 | Uram et al. | |
| 2010/0141392 A1 | 6/2010 | Jo et al. | |
| 2010/0180144 A1 | 7/2010 | Groseclose, Jr. et al. | |
| 2010/0188260 A1 | 7/2010 | Cornwall et al. | |
| 2010/0202471 A1 * | 8/2010 | Maki | H04B 3/542 370/442 |
| 2010/0217549 A1 | 8/2010 | Galvin et al. | |
| 2010/0217550 A1 | 8/2010 | Crabtree et al. | |
| 2010/0262313 A1 | 10/2010 | Chambers et al. | |
| 2010/0262393 A1 | 10/2010 | Sharma et al. | |
| 2010/0286840 A1 | 11/2010 | Powell et al. | |
| 2010/0296560 A1 | 11/2010 | Sadan et al. | |

(56) References Cited

U.S. PATENT DOCUMENTS

| | | |
|---|---|---|
| 2010/0296590 A1* | 11/2010 | Takasu .................. H04B 3/542 375/257 |
| 2010/0306533 A1 | 12/2010 | Phatak |
| 2011/0026621 A1 | 2/2011 | Kim et al. |
| 2011/0035073 A1 | 2/2011 | Ozog |
| 2011/0040419 A1 | 2/2011 | Kogler et al. |
| 2011/0040803 A1 | 2/2011 | Pasquero et al. |
| 2011/0043340 A1 | 2/2011 | Kim et al. |
| 2011/0103429 A1 | 5/2011 | Tanaka et al. |
| 2011/0106321 A1 | 5/2011 | Cherian et al. |
| 2011/0109320 A1 | 5/2011 | Curt et al. |
| 2011/0118888 A1 | 5/2011 | White, II |
| 2011/0121654 A1 | 5/2011 | Recker et al. |
| 2011/0122798 A1 | 5/2011 | Hughes et al. |
| 2011/0130991 A1 | 6/2011 | Koste et al. |
| 2011/0130992 A1 | 6/2011 | Kolwalkar et al. |
| 2011/0133655 A1 | 6/2011 | Recker et al. |
| 2011/0140911 A1 | 6/2011 | Pant et al. |
| 2011/0196546 A1 | 8/2011 | Muller et al. |
| 2011/0208468 A1 | 8/2011 | Yamamoto et al. |
| 2011/0212700 A1 | 9/2011 | Petite |
| 2011/0216747 A1 | 9/2011 | Shao et al. |
| 2011/0224935 A1 | 9/2011 | Hampel et al. |
| 2011/0267202 A1 | 11/2011 | Efthymiou et al. |
| 2011/0282508 A1 | 11/2011 | Goutard et al. |
| 2011/0285382 A1 | 11/2011 | Kolwalkar et al. |
| 2012/0020395 A1* | 1/2012 | Domanovitz ............ H04B 3/32 375/222 |
| 2012/0026908 A1 | 2/2012 | Tzannes et al. |
| 2012/0036250 A1 | 2/2012 | Vaswani et al. |
| 2012/0041696 A1 | 2/2012 | Sanderford, Jr. et al. |
| 2012/0052870 A1 | 3/2012 | Habicher |
| 2012/0062210 A1 | 3/2012 | Veillette |
| 2012/0062390 A1 | 3/2012 | Solomon |
| 2012/0068784 A1 | 3/2012 | Varadarajan et al. |
| 2012/0075099 A1 | 3/2012 | Brown |
| 2012/0086459 A1 | 4/2012 | Kim |
| 2012/0123606 A1 | 5/2012 | Mollenkopf et al. |
| 2012/0128080 A1* | 5/2012 | Woo .......................... H04B 3/54 375/257 |
| 2012/0136500 A1 | 5/2012 | Hughes |
| 2012/0137126 A1 | 5/2012 | Matsuoka et al. |
| 2012/0139554 A1 | 6/2012 | Parsons |
| 2012/0155557 A1 | 6/2012 | Bush et al. |
| 2012/0158329 A1 | 6/2012 | Hurri et al. |
| 2012/0185838 A1 | 7/2012 | Schwartzman et al. |
| 2012/0195355 A1 | 8/2012 | El-Essawy et al. |
| 2012/0201145 A1 | 8/2012 | Ree et al. |
| 2012/0201155 A1 | 8/2012 | Du et al. |
| 2012/0223840 A1 | 9/2012 | Guymon et al. |
| 2012/0232915 A1 | 9/2012 | Bromberger |
| 2012/0236879 A1 | 9/2012 | Oksman et al. |
| 2012/0242499 A1 | 9/2012 | Ree et al. |
| 2012/0245869 A1 | 9/2012 | Ansari |
| 2012/0250864 A1 | 10/2012 | Nishibayashi et al. |
| 2012/0265355 A1 | 10/2012 | Bernheim et al. |
| 2012/0266209 A1 | 10/2012 | Gooding et al. |
| 2012/0275084 A1 | 11/2012 | Familiant et al. |
| 2012/0275526 A1 | 11/2012 | Hughes et al. |
| 2012/0280565 A1 | 11/2012 | Logvinov |
| 2012/0294342 A1 | 11/2012 | Schneider et al. |
| 2012/0307646 A1 | 12/2012 | Xia et al. |
| 2012/0310424 A1 | 12/2012 | Taft et al. |
| 2012/0310558 A1 | 12/2012 | Taft et al. |
| 2012/0313620 A1 | 12/2012 | Swarztrauber et al. |
| 2012/0314782 A1 | 12/2012 | Boivin et al. |
| 2012/0314868 A1 | 12/2012 | Bernheim et al. |
| 2012/0316696 A1 | 12/2012 | Boardman et al. |
| 2012/0323388 A1 | 12/2012 | Littrell et al. |
| 2012/0327989 A1 | 12/2012 | Zhang et al. |
| 2013/0013232 A1 | 1/2013 | Parwal et al. |
| 2013/0031201 A1 | 1/2013 | Kagan et al. |
| 2013/0034086 A1 | 2/2013 | Martin et al. |
| 2013/0063273 A1 | 3/2013 | Bhageria et al. |
| 2013/0067253 A1 | 3/2013 | Tsuda |
| 2013/0121157 A1 | 5/2013 | Logvinov et al. |
| 2013/0132555 A1 | 5/2013 | Wang et al. |
| 2013/0151177 A1 | 6/2013 | Hughes |
| 2013/0193767 A1 | 8/2013 | Carralero et al. |
| 2013/0194975 A1 | 8/2013 | Vedantham et al. |
| 2013/0204450 A1 | 8/2013 | Kagan et al. |
| 2013/0257452 A1 | 10/2013 | DeLeo et al. |
| 2014/0035372 A1 | 2/2014 | Normoyle et al. |
| 2014/0062719 A1 | 3/2014 | Rowitch et al. |
| 2014/0105313 A1 | 4/2014 | Kim et al. |
| 2014/0118163 A1 | 5/2014 | Li et al. |
| 2014/0125125 A1 | 5/2014 | Wyatt |
| 2014/0140358 A1 | 5/2014 | Kim et al. |
| 2014/0167735 A1 | 6/2014 | Beroset |
| 2014/0172723 A1 | 6/2014 | Borisov et al. |
| 2014/0191568 A1 | 7/2014 | Partovi |
| 2014/0233620 A1 | 8/2014 | Bernheim et al. |
| 2014/0233662 A1 | 8/2014 | Hansell et al. |
| 2014/0236365 A1 | 8/2014 | Martin et al. |
| 2014/0236366 A1 | 8/2014 | Livadaras et al. |
| 2014/0236506 A1 | 8/2014 | Nikovski et al. |
| 2014/0300210 A1 | 10/2014 | Abi-Ackel et al. |
| 2014/0359595 A1 | 12/2014 | Sehgal et al. |
| 2014/0361907 A1 | 12/2014 | Bernheim et al. |
| 2014/0368189 A1 | 12/2014 | Bernheim et al. |
| 2015/0241488 A1 | 8/2015 | Sonderegger |
| 2015/0316620 A1 | 11/2015 | Luan et al. |
| 2015/0323582 A1 | 11/2015 | Pigeon |
| 2016/0124421 A1 | 5/2016 | Hansell et al. |
| 2016/0127242 A1 | 5/2016 | Hansell et al. |
| 2016/0164287 A1 | 6/2016 | Bernheim |
| 2016/0285511 A1 | 9/2016 | Hansell et al. |
| 2017/0344047 A1 | 11/2017 | Cioraca et al. |

FOREIGN PATENT DOCUMENTS

| | | |
|---|---|---|
| EP | 0 629 098 | 12/2001 |
| EP | 1 901 145 | 3/2008 |
| EP | 2330430 A1 | 6/2011 |
| EP | 2 566 125 | 3/2013 |
| EP | 3116084 A1 | 1/2017 |
| JP | H01106652 A | 4/1989 |
| JP | H09501766 A | 2/1997 |
| JP | 2003258689 A | 9/2003 |
| JP | 2003-339120 | 11/2003 |
| JP | 2003-259696 | 12/2003 |
| JP | 2004015840 A | 1/2004 |
| JP | 2004147063 A | 5/2004 |
| JP | 2005252671 A | 9/2005 |
| JP | 2006262570 A | 9/2006 |
| JP | 2007-185083 | 7/2007 |
| JP | 2008-508781 | 3/2008 |
| JP | 2008-098812 | 4/2008 |
| JP | 2008-124859 | 5/2008 |
| JP | 2010156694 A | 7/2010 |
| JP | 2010161923 A | 7/2010 |
| JP | 2010533843 A | 10/2010 |
| JP | 2010268121 A | 11/2010 |
| JP | 2011525787 A | 9/2011 |
| JP | 2012227928 A | 11/2012 |
| JP | 2012235457 A | 11/2012 |
| JP | 2013-005718 | 1/2013 |
| JP | 2013106255 A | 5/2013 |
| WO | 9501030 A1 | 1/1995 |
| WO | 9806187 A1 | 2/1998 |
| WO | 2009067250 A1 | 5/2009 |
| WO | 2010027421 A2 | 3/2010 |
| WO | WO2010141859 | 12/2010 |
| WO | 2013006273 A2 | 1/2013 |
| WO | 2013013162 A2 | 1/2013 |
| WO | 2013030937 A1 | 3/2013 |
| WO | 2014006662 A1 | 1/2014 |

(56) References Cited

FOREIGN PATENT DOCUMENTS

| WO | 2014062967 A1 | 4/2014 |
|---|---|---|
| WO | 2014096911 A1 | 6/2014 |

OTHER PUBLICATIONS

International Preliminary Report on Patentability for PCT/US2014/042300, dated Dec. 23, 2015, 9 pages.
International Preliminary Report on Patentability for PCT/US2014/042393, dated Dec. 23, 2015, 11 pages.
Office Action for Canadian Patent Application No. 2,727,034, dated Nov. 26, 2015, 4 pages.
Decision of Final Rejection for Japanese Patent Application No. 2014-119504, dated Nov. 10, 2015, 5 pages.
Translation of Decision to Grant for Japanese Patent Application No. 2014-119505, dated Dec. 15, 2015, 3 pages.
Office Action for Cuban Patent Application No. 2015-0088, dated Oct. 30, 2015, 3 pages.
Final Office Action for U.S. Appl. No. 13/888,102, dated Dec. 24, 2015, 18 pages.
Non-Final Office Action for U.S. Appl. No. 13/911,849, dated Nov. 24, 2015, 15 pages.
Sendin, Alberto, et al., "Enhanced Operation of Electricity Distribution Grids Through Smart Metering PLC Network Monitoring, Analysis and Grid Conditioning," Energies, vol. 6, Issue 1, Jan. 21, 2013, www.mdpi.com/journal/energies, pp. 539-556.
Wetula, Andrzej, "A Hilbert Transform Based Algorithm for Detection of a Complex Envelope of a Power Grid Signals—an Implementation," Journal of Electrical Power Quality and Utilisation, vol. 14, Issue 2, 2008, EPQU Journal, pp. 13-18.
Partial Supplementary European Search Report for European Patent Application No. 14754343.3, dated Feb. 8, 2016, 5 pages.
Notice of Allowance and Examiner Initiated Interview Summary for U.S. Appl. No. 13/911,849, dated Apr. 5, 2016, 10 pages.
Non-Final Office Action for U.S. Appl. No. 14/304,035, dated Feb. 25, 2016, 22 pages.
Non-Final Office Action for U.S. Appl. No. 14/720,780, dated Feb. 26, 2016, 7 pages.
Notice of Allowance for U.S. Appl. No. 13/566,481, dated Feb. 26, 2016, 7 pages.
International Search Report and Written Opinion for International Patent Application No. PCT/US2015/058423, dated Jan. 19, 2016, 12 pages.
International Search Report and Written Opinion for International Patent Application No. PCT/US2015/058492, dated Feb. 26, 2016, 18 pages.
International Search Report and Written Opinion for International Patent Application No. PCT/US2015/063752, dated Mar. 24, 2016, 16 pages.
Colson, C.M., "Algorithms for Distributed Decision-Making for Multi-agent Microgrid Power Management," IEEE Power and Energy Society General Meeting, Jul. 24-29, 2011, San Diego, California, IEEE, pp. 1-8.
Extended European Search Report for European Patent Application No. 14754343.3, dated May 24, 2016, 12 pages.
Examination Report for European Patent Application No. 09759619.1, dated May 13, 2016, 7 pages.
International Preliminary Report on Patentability for International Patent Application No. PCT/US2012/033789, dated Oct. 24, 2013, 10 pages.
International Preliminary Report on Patentability for PCT/US2012/041971, dated Dec. 10, 2013, 6 pages.
International Preliminary Report on Patentability for PCT/US2012/049524, dated Feb. 4, 2014, 7 pages.
Final Office Action for U.S. Appl. No. 13/896,029, dated Jun. 22, 2016, 22 pages.
Final Office Action for U.S. Appl. No. 13/871,944, dated Jun. 21, 2016, 22 pages.

Corrected Notice of Allowance for U.S. Appl. No. 13/911,849, dated May 31, 2016, 4 pages.
Final Office Action for U.S. Appl. No. 13/448,005, dated Jun. 6, 2016, 11 pages.
M. Dilek "Integrated Design of Electrical Design Distribution Systems: Phase Balancing and Phase prediction Case Studies", http://scholar.lib.vt.edu/theses/available/etd-11132001-222401/unrestricted/mdilekETD/pdf (2001).
"TWACS low Frequency Power Line Communication Signals Problematic to Public Health", pp. 1-20, http://www.eiwellspring.org/smartmeter/TWACS.htm (May 3, 2013).
G3-PLC alliance, "The G3 PLC Alliance Unveils its Interoperability Process." Paris, The G3 PLC Alliance, http://www.g3-plc.com/, p. 1 (Oct. 2012).
Prime Alliance Official Web Site http://www.prime-alliance.org ( ).
McGhee et al., "Smart High Voltage Substation based on IEC 61850 Process Bus and IEEE 1588 Time Synchronization" 2010 First IEEE International Conference on Smart Grid Communications, published/presented on Oct. 4-6, 2010. (Oct. 4, 2010).
Pallares-Lopez et al., "Embedding synchronism in SmartGrid with IEEE1588-based for Intelligent Electronics" 2010 First IEEE International Conference on Smart Grid Communications, published/presented Oct. 4-6, 2010 (Oct. 4, 2010).
Cuthbert Nyack, "Convolution and Autocorrelation," http://cnyack.homestead.com/files/aconv/convau1 .ht, Web. (Jun. 7, 2009)
Dermot Collins et al., "Transmission on Power Line Cables," Telektronikk 2/3, (1999).
Chong Hock K. Goh, "A Current Study of Automatic Meter Reading Solutions via Power Line Communications," http://wpweb2k.gsia.cmu.edu/ceic/publicatons.htm. ((Published 2003 or later as evidenced by the bibliography)).
K.B. HA, "Power Line Communication Technology," Presentation at Hong Kong Institute of Engineers Seminar on Last Mile Technology, (Jun. 20, 2003).
Olaf G. Hooijen, "A Channel Model for the Residential Power Circuit Used as a Digital Communications Medium," IEEE Transactions on Electromagnetic Compatibility, 40(4): pp. 331-336, (Nov. 1998).
Luis F. Montoya, "Power Line Communications Performance Overview of the Physical Layer of Available Protocols," Thesis of Research, University of Florida, Gainesville, Florida, pp. 1-15 (publication date unknown).
J.E. Newbury, "Efficient Communication Services Using the Low Voltage Distribution Line," Proceedings of 2002 PES Winter Meeting, pp. 579-591, (2002).
Niovi Pavlidou, et al., "Power Line Communications: State of the Art and Future Trends," IEEE Communications Magazine, 41(4): pp. 34-40, (Apr. 2003).
Gerald Schickhuber and Oliver McCarthy, "Control Using Power Lines—A European View," Computing & Control Engineering Journal, 8(4): pp. 180-184, (Aug. 1997).
Petrus A. Hanse Van Rensburg and Hendrik C. Ferreira, "Design of a Bidirectional Impedance-Adapting Transformer Coupling Circuit for Low-Voltage Power-Line Communications," IEEE Transactions on Power Delivery, 20(1); pp. 64-70 (Jan. 2005).
Universal Powerline Bus Communication Technology Overview, http://pulseworx.com/downloads/upb/UpbOverview.pdf (Jan. 8, 2002).
X-10 (U.S.A.) Inc., X-10.RTM. Powerhouse (TM) Technical Note, "The X-10 Powerhouse Power Line Interface Model #PL513 and Two-Way Power Line Interface Model #TW523", 12 pages, Revision 2.4, Dave Rye, (1991).
Moreno-Munoz A., et al., "Integrating Power Quality to Automated Meter Reading", IEEE Industrial Electronics Magazine, IEEE, US, vol. 2, No. 2, pp. 10-18 (Jun. 17, 2008).
Moonsuk Choi, et al., "Design of Integrated Meter Reading System based on Power-Line Communication", Power Line Communications and Its Applications, IEEE, International Symposium, pp. 280-284 (Apr. 2, 2008).
Paola Bresesti, et al., "SDNO: Smart Distribution Network Operation Project", Power Engineering Society General Meeting, IEEE, pp. 1-4 (Jun. 1, 2007).
EnergyIdeas Clearinghouse PTR #6. Product and Technology Review. MicroPlanet® Voltage Regulators for residential and small com-

(56) References Cited

OTHER PUBLICATIONS mercial applications. http://www.energyideas.org/documents/factsheets/PTR/Microplanet.pdf pp. 1-5 (Jun. 4, 2008).
Fierce Energy Daily. "Dominion Conservation Voltage Reduction software reduces energy use by 2.8%." http://www.fierceenergy.com/story/dominion-conservation-voltage-reduction-software-reduces-energy-use-28/2011-09-27, pp. 1-3. (Sep. 17, 2011).
RenewGRID. "CVR has Potential Beyond Pushing Efficiencies on Feeders." Bates, Michael. http://www.renew-grid.com/e107 plugins/contenl/contenl.php?contenl.8215, pp. 1-2. (Mar. 25, 2012).
Angelo Baggini "Handbook of Power Quality" (Jun. 2008).
Sherman et al, "Location Authentication through Power Line Communication: Design, Protocol, and Analysis of a New Out of Band Strategy", 2010, Cyber Defense Lab, Department of CSEE, University of Maryland, Baltimore County, IEEE, p. 279-284 (2010).
International Search Report in Application No. PCT/US2014/042393, dated Oct. 20, 2014.
File History for U.S. Appl. No. 13/911,849 as accessed from U.S. Patent and Trademark Office.
File History for U.S. Serial No. PCT/US2014/041396 as accessed from U.S. Patent and Trademark Office.
File History for U.S. Appl. No. 14/304,035 as accessed from U.S. Patent and Trademark Office.
File History for U.S. Serial No. PCT/US2014/042300 as accessed from U.S. Patent and Trademark Office.
File History for U.S. Serial No. PCT/US2014/042393 as accessed from U.S. Patent and Trademark Office.
File History for U.S. Appl. No. 12/480,493 as accessed from U.S. Patent and Trademark Office.
File History for U.S. Serial No. PCT/US2009/046644 as accessed from U.S. Patent and Trademark Office.
File History for U.S. Appl. No. 13/448,005 as accessed from U.S. Patent and Trademark Office.
File History for U.S. Serial No. PCT/US2012/033789 as accessed from U.S. Patent and Trademark Office
File History for U.S. Appl. No. 13/493,983 as accessed from U.S. Patent and Trademark Office.
File History for U.S. Serial No. PCT/US2012/041971 as accessed from U.S. Patent and Trademark Office.
File History for U.S. Appl. No. 13/566,481 as accessed from U.S. Patent and Trademark Office.
File History for U.S. Serial No. PCT/US2012/049524 as accessed from U.S. Patent and Trademark Office.
File History for U.S. Appl. No. 13/888,102 as accessed from U.S. Patent and Trademark Office.
File History for U.S. Serial No. PCT/US2014/016535 as accessed from U.S. Patent and Trademark Office.
File History for U.S. Appl. No. 13/896,029 as accessed from U.S. Patent and Trademark Office.
File History for U.S. Serial No. PCT/US2014/016538 as accessed from U.S. Patent and Trademark Office.
File History for U.S. Appl. No. 13/871,944 as accessed from U.S. Patent and Trademark Office.
File History for U.S. Serial No. PCT/US2014/016540 as accessed from U.S. Patent and Trademark Office
International Search Report for PCT/US2014/016538, dated Jun. 16, 2014, 3 pages.
International Preliminary Report on Patentability for PCT/US2014/016538, dated Sep. 3, 2015, 10 pages.
International Search Report for PCT/US2014/016540, dated Jun. 17, 2014, 3 pages.
International Preliminary Report on Patentability for PCT/US2014/016540, dated Sep. 3, 2015, 9 pages.
International Search Report for PCT/US2014/016535, dated Jun. 3, 2014, 2 pages.
International Preliminary Report on Patentability for PCT/US2014/016535, dated Sep. 3, 2015, 8 pages.
International Search Report and Written Opinion for PCT/US2014/041396, dated Oct. 29, 2014, 12 pages.
International Search Report and Written Opinion for PCT/US2014/042300, dated Oct. 20, 2014, 16 pages.
International Search Report for PCT/US2009/046644, dated Mar. 2, 2010, 7 pages.
International Preliminary Report on Patentability for PCT/US2009/046644, dated Dec. 6, 2010, 10 pages.
International Search Report for PCT/US2012/033789, dated Sep. 6, 2012, 4 pages.
International Search Report for PCT/US2012/041971, dated Dec. 7, 2012, 5 pages.
International Search Report for PCT/US2012/049524, dated Jan. 3, 2013, 3 pages.
Non-Final Office Action for U.S. Appl. No. 13/566,481, dated Aug. 7, 2015, 27 pages.
Non-Final Office Action for U.S. Appl. No. 13/493,983, dated Feb. 5, 2014, 11 pages.
Final Office Action for U.S. Appl. No. 13/493,983, dated Oct. 31, 2014, 12 pages.
Non-Final Office Action for U.S. Appl. No. 13/448,005, dated Sep. 11, 2014, 20 pages.
Non-Final Office Action for U.S. Appl. No. 13/448,005, dated Apr. 15, 2015, 22 pages.
Non-Final Office Action for U.S. Appl. No. 12/480,493, dated Jul. 16, 2012, 24 pages.
Notice of Allowance and Examiner-Initiated Interview Summary for U.S. Appl. No. 12/480,493, dated Jun. 20, 2013, 13 pages.
Non-Final Office Action for U.S. Appl. No. 13/896,029, dated Sep. 18, 2015, 16 pages.
Non-Final Office Action for U.S. Appl. No. 13/871,944, dated Oct. 16, 2015, 13 pages.
Non-Final Office Action for U.S. Appl. No. 13/888,102, dated Jul. 9, 2015, 18 pages.
Search Report for Japanese Patent Application No. 2011-512749, search dated Aug. 14, 2013, 29 pages.
Office Action for Japanese Patent Application No. 2011-512749, dated Sep. 4, 2013, 7 pages.
Advisory Action for U.S. Appl. No. 14/304,035, dated Nov. 30, 2016, 3 pages.
Extended European Search Report for European Patent Application No. 14754339.1, dated Jan. 16, 2017, 10 pages.
Office Action No. 13556 for Colombian Patent Application No. 15-222367, dated Nov. 28, 2016, 13 pages.
Examination Report No. 1 for Australian Patent Application No. 2014219244, dated Dec. 21, 2016, 4 pages.
Extended European Search Report for European Patent Application No. 14754714.5, dated Jan. 16, 2017, 10 pages.
Extended European Search Report for European Patent Application No. 14808081.5, dated Jan. 30, 2017, 7 pages.
Extended European Search Report for European Patent Application No. 14810273.4, dated Feb. 1, 2017, 12 pages.
Extended European Search Report for European Patent Application No. 14811042.2, dated Jan. 2, 2017, 7 pages.
Examination Report No. 1 for Australian Patent Application No. 2014219246, dated Dec. 22, 2016, 3 pages.
Padial Supplementary European Search Report for European Patent Application No. 14754339.1, dated Oct. 4, 2016, 6 pages.
Padial Supplementary European Search Report for European Patent Application No. 14754714.5, dated Oct. 6, 2016, 6 pages.
Non-Final Office Action for U.S. Appl. No. 13/896,029, dated Nov. 10, 2016, 18 pages.
Notice of Allowance for U.S. Appl. No. 13/871,944, dated Oct. 4, 2016, 9 pages.
Final Office Action for U.S. Appl. No. 14/304,035, dated Aug. 26, 2016, 18 pages.
Final Office Action for U.S. Appl. No. 14/720,780, dated Sep. 1, 2016, 9 pages.
Notice of Allowance for U.S. Appl. No. 14/720,780, dated Nov. 4, 2016, 5 pages.
Non-Final Office Action for U.S. Appl. No. 15/177,930, dated Mar. 3, 2017, 6 pages.
Non-Final Office Action for U.S. Appl. No. 15/184,642, dated Mar. 9, 2017, 5 pages.

(56) References Cited

OTHER PUBLICATIONS

First Office Action for Chilean Patent Application No. 2325-2015, dated Jan. 26, 2017, 13 pages.
First Office Action for Chilean Patent Application No. 2323-2015, dated Jan. 26, 2017, 15 pages.
Office Action No. 11851, Colombian Patent Application No. 15-222367, dated Mar. 17, 2017, 19 pages.
First Office Action for Chilean Patent Application No. 2322-2015, dated Jan. 26, 2017, 15 pages.
First Office Action for Chinese Patent Application No. 201480032631.X, dated Feb. 27, 2017, 5 pages.
First Office Action for Chinese Patent Application No. 201480034010.5, dated Feb. 17, 2017, 7 pages.
Translated Summary of Office Action No. 4963 for Columbian Patent Application No. 15-222371, dated Apr. 5, 2017, 3 pages.
International Preliminary Report on Patentability for International Patent Application No. PCT/US2015/058423, dated May 11, 2017, 8 pages.
International Preliminary Report on Patentability for International Patent Application No. PCT/US2015/058492, dated May 11, 2017, 10 pages.
Non-Final Office Action for U.S. Appl. No. 13/871,944, dated Jun. 15, 2017, 14 pages.
Non-Final Office Action for U.S. Appl. No. 14/304,035, dated May 17, 2017, 22 pages.
Non-Final Office Action for U.S. Appl. No. 14/928,783, dated May 8, 2017, 16 pages.
Examination Report No. 1 for Australian Patent Application No. 2014219247, dated Apr. 26, 2017, 4 pages.
Second Office Action for Chilean Patent Application No. 2323-2015, dated May 17, 2017, 14 pages.
Second Office Action for Chilean Patent Application No. 2322-2015, dated May 17, 2017, 13 pages.
First Office Action for Chinese Patent Application No. 201480009549.5, dated May 31, 2017, 9 pages.
Examination Report No. 1 for Australian Patent Application No. 2014277951, dated Jun. 8, 2017, 4 pages.
Office Action Summary for Columbian Patent Application No. 7058, dated Jun. 16, 2017, 2 pages.
International Preliminary Report on Patentability for International Patent Application No. PCT/US2015/063752, dated Jun. 15, 2017, 12 pages.
Second Office Action for Chinese Patent Application No. 201480032631.X, dated Sep. 4, 2017, 5 pages.
Second Office Action for Chinese Patent Application No. 201480034010.5, dated Aug. 2, 2017, 5 pages.
Non-Final Office Action for U.S. Appl. No. 13/896,029, dated Jul. 20, 2017, 17 pages.
Notice of Allowance for U.S. Appl. No. 15/184,642, dated Jul. 13, 2017, 8 pages.
Notice of Allowance for U.S. Appl. No. 15/184,642, dated Jul. 27, 2017, 4 pages.
Notice of Allowance for U.S. Appl. No. 14/929,087, dated Aug. 15, 2017, 9 pages.
Non-Final Office Action for U.S. Appl. No. 15/177,930, dated Nov. 1, 2017, 14 pages.
Notice of Allowance for U.S. Appl. No. 14/928,783, dated Nov. 6, 2017, 9 pages.
Advisory Action for U.S. Appl. No. 14/304,035, dated Dec. 29, 2017, 3 pages.
Final Office Action for U.S. Appl. No. 13/896,029, dated Jan. 24, 2018, 22 pages.
Notice of Allowance for U.S. Appl. No. 13/871,944, dated Feb. 23, 2018, 18 pages.
Notice of Allowance for U.S. Appl. No. 14/304,035, dated Feb. 7, 2018, 9 pages.
Corrected Notice of Allowance for U.S. Appl. No. 14/928,783, dated Jan. 23, 2018, 6 pages.
Corrected Notice of Allowance for U.S. Appl. No. 14/928,783, dated Feb. 15, 2018, 6 pages.
Notice of Allowance for U.S. Appl. No. 15/852,496, dated Mar. 8, 2018, 9 pages.
Non-Final Office Action for U.S. Appl. No. 14/958,385, dated Jan. 12, 2018, 33 pages.
International Telecommunications Union, "ITU-T G.9960, Series G: Transmission Systems and Media, Digital Systems and Networks," Dec. 1, 2011, 160 pages.
International Telecommunications Union, "Updated draft text for ITU-T G.9961, Series G: Transmission Systems and Media, Digital Systems and Networks—Amendment 1 Corrigendum 1," ITU-T: Telecommunication Standardization Sector, Study Group 15, Amendment approved Sep. 21, 2012, 82 pages.
International Telecommunications Union, "ITU-T G.9961, Series G: Transmission Systems and Media, Digital Systems and Networks," Apr. 1, 2014, 306 pages.
First Office Action for Chinese Patent Application No. 201480009550.8, dated Jan. 26, 2018, 4 pages.
Decision to Grant a Patent for Japanese Patent Application No. 2015-558888, dated Jan. 30, 2018, 4 pages.
Notice of Reasons for Rejection for Japanese Patent Application No. 2015-558889, dated Jan. 23, 2018, 7 pages.
Extended European Search Report for European Patent Application No. 17203296.3, dated Feb. 15, 2018, 8 pages.
Second Office Action for Chinese Patent Application No. 201480009549.5, dated Jan. 23, 2018, 4 pages.
Notice of Reasons for Rejection for Japanese Patent Application No. 2015-558887, dated Jan. 23, 2018, 7 pages.
Notice of Reasons for Rejection for Japanese Patent Application No. 2016-518052, dated Feb. 20, 2018, 8 pages.
Third Office Action for Chinese Patent Application No. 201480034010.5, dated Jan. 17, 2018, 4 pages.
Notice of Reasons for Rejection for Japanese Patent Application No. 2016-519694, dated Feb. 27, 2018, 11 pages.
First Examination Report for Indian Patent Application No. 13/CHENP/2011, dated Jan. 11, 2018, 6 pages.
Office Action for Canadian Patent Application No. 2,870,452, dated Dec. 28, 2017, 4 pages.
Office Action for Canadian Patent Application No. 2,874,132, dated Jan. 25, 2018, 3 pages.
Extended European Search Report for European Patent Application No. 15853935.3, dated Feb. 15, 2018, 10 pages.
Extended European Search Report for European Patent Application No. 15855864.3, dated Feb. 21, 2018, 9 pages.
Yan, Ping et al., "Study of Linear Models in Steady State Load Flow Analysis of Power Systems," IEEE Power Engineering Society Winter Meeting, vol. 1, Jan. 27-31, 2002, New York, NY, IEEE, pp. 666-671.
First Office Action for Chinese Patent Application No. 201480009551.2, dated Jun. 19, 2017, 9 pages.
Extended European Search Report for European Patent Application No. 17173049.2, dated Aug. 11, 2017, 8 pages.
Examination report No. 1 for Australian Patent Application No. 2014277983, dated Jun. 16, 2017, 4 pages.
Office Action for Colombian Patent Application No. 15222371, dated Oct. 15, 2017, 9 pages.
First Office Action for Chinese Patent Application No. 201480034011.X, dated Oct. 30, 2017, 16 pages.
Notice of Acceptance for Australian Patent Application No. 2014219246, dated Dec. 5, 2017, 3 pages.
Office Action for Mexican Patent Application No. MX/a/2015/017231, dated Oct. 20, 2017, 13 pages.
Supplemental Notice of Allowability for U.S. Appl. No. 14/304,035, dated Apr. 18, 2018, 6 pages.
Non-Final Office Action for U.S. Appl. No. 15/934,499, dated May 7, 2018, 30 pages.
Non-Final Office Action for U.S. Appl. No. 15/257,191, dated Apr. 4, 2018, 10 pages.
Non-Final Office Action for U.S. Appl. No. 15/450,153, dated Apr. 19, 2018, 10 pages.
Notice of Allowance for U.S. Appl. No. 14/928,783, dated May 9, 2018, 9 pages.
Interview Summary for U.S. Appl. No. 14/958,385, dated Apr. 6, 2018, 3 pages.

(56) References Cited

OTHER PUBLICATIONS

Extended European Search Report for European Patent Application No. 18152637.7, dated Apr. 26, 2018, 8 pages.
Notice of Acceptance for Australian Patent Application No. 2014219247, dated Apr. 11, 2018, 3 pages.
Second Examination Report for Australian Patent Application No. 2014277983, dated Mar. 15, 2018, 4 pages.
Second Official Action for Mexican Patent Application No. MX/a/2015/017231, dated Feb. 28, 2018, 5 pages.
Notice of Acceptance for Australian Patent Application No. 2014277951, dated Mar. 28, 2018, 3 pages.
Extended European Search Report for European Patent Application No. 15865305.5, dated May 3, 2018, 8 pages.
Final Office Action for U.S. Appl. No. 14/304,035, dated Oct. 5, 2017, 16 pages.
First Official Action for Mexican Patent Application No. MX/a/2017/005506, dated Jun. 8, 2018, 6 pages.
First Official Action for Mexican Patent Application No. MX/a/2017/005005, dated May 30, 2018, 4 pages.
First Official Action for Mexican Patent Application No. MX/a/2017/006836, dated Jun. 1, 2018, 6 pages.
Berger, L. T., et al., "Power Line Communications for Smart Grid Applications," Journal of Electrical and Computer Engineering, vol. 2013, Article ID 712376, Accepted Dec. 29, 2012, 16 pages.
Hauser, C. H., et al., "A Failure to Communicate: Next Generation Communication Requirements, Technologies, and Architecture for the Electric Power Grid," IEEE Power and Energy Magazine, vol. 3, Issue 2, Mar.-Apr. 2005, pp. 47-55.
Kang, J.-M., et al., "Design and Implementation of Network Management System for Power Line Communication Network," 2007 IEEE International Symposium on Power Line Communications and Its Adaptations, Mar. 26-28, 2007, Pisa, Italy, pp. 23-28.
Kim, Y., et al., "PLC technology of KEPCO," 2005 International Symposium on Power Line Communications and Its Applications, Apr. 6-8, 2005, Vancouver, British Columbia, Canada, pp. 390-393.
Papadopoulos, T. A., et al., Low-Voltage Distribution Line Performance Evaluation for PLC Signal Transmission, IEEE Transactions on Power Delivery, vol. 23, Issue 4, Oct. 2008, pp. 1903-1910.
Non-Final Office Action for U.S. Appl. No. 15/078,646, dated Jun. 15, 2018, 33 pages.
Supplemental Notice of Allowability for U.S. Appl. No. 14/304,035, dated May 24, 2018, 6 pages.
Corrected Notice of Allowance for U.S. Appl. No. 14/928,783, dated Jun. 8, 2018, 6 pages.
Advisory Action for U.S. Appl. No. 14/958,385, dated Sep. 26, 2018, 3 pages.
Non-Final Office Action for U.S. Appl. No. 13/896,029, dated Oct. 2, 2018, 19 pages.
Official Action No. 5493 for Colombian Patent Application No. NC2017/0010584, dated May 4, 2018, 35 pages.
First Official Action for Mexican Patent Application No. MX/a/2015/017227, dated Apr. 11, 2018, 6 pages.
Notice of Acceptance for Australian Patent Application No. 2014277983, dated Jun. 25, 2018, 3 pages.
Notification of Reasons for Refusal for Japanese Patent Application No. 2016-519676, dated Jun. 12, 2018, 7 pages.
Final Office Action for U.S. Appl. No. 15/177,930, dated Jul. 26, 2018, 17 pages.
Corrected Notice of Allowability for U.S. Appl. No. 14/928,783, dated Jul. 30, 2018, 6 pages.
Final Office Action for U.S. Appl. No. 14/958,385, dated Jul. 26, 2018, 21 pages.
Corrected Notice of Allowability for U.S. Appl. No. 14/928,783, dated Aug. 10, 2018, 6 pages.
First Substantive Report for Chilean Patent Application No. 201701036, dated Jul. 20, 2018, 17 pages.
Second Substantive Report for Chilean Patent Application No. 201701038, dated Sep. 3, 2018, 28 pages.
Second Substantive Report for Chilean Patent Application No. 201701394, dated Sep. 12, 2018, 10 pages.
Examination Report No. 1 for Australian Patent Application No. 2017279752, dated Sep. 18, 2018, 6 pages.
Non-Final Office Action for U.S. Appl. No. 15/177,930, dated Nov. 29, 2018, 15 pages.
Final Office Action for U.S. Appl. No. 15/450,153, dated Nov. 28, 2018, 7 pages.
Final Office Action for U.S. Appl. No. 15/934,499, dated Nov. 19, 2018, 34 pages.
Final Office Action for U.S. Appl. No. 15/257,191, dated Nov. 2, 2018, 10 pages.
Notice of Not Fully Responsive Reply for Applications Under Accelerated Examination for U.S. Appl. No. 15/078,646, dated Jan. 24, 2019, 8 pages.
Advisory Action and AFCP 2.0 Decision for U.S. Appl. No. 15/934,499, dated Jan. 30, 2019, 4 pages.
Office Action for Canadian Patent Application No. 2,874,132, dated Jan. 3, 2019, 3 pages.
Second Official Action for Mexican Patent Application No. MX/a/2017/006836, dated Dec. 6, 2018, 8 pages.
Official Action for Mexican Patent Application No. MX/a/2015/016809, dated Jan. 14, 2019, 4 pages.
Examinees Report for Canadian Patent Application No. 2,870,452, dated Oct. 2, 2018, 4 pages.
Examination Report for European Patent Application No. 15853935.3, dated Oct. 22, 2018, 5 pages.
Decision to Grant for Japanese Patent Application No. 2016-519676, dated Apr. 16, 2019, 4 pages.
Examination Report No. 1 for Australian Patent Application No. 2015358448, dated May 6, 2019, 3 pages.
Third Official Action for Mexican Patent Application No. MX/a/2017/006836, dated Jun. 4, 2019, 7 pages.
Notice of Allowance for U.S. Appl. No. 15/177,930, dated Sep. 13, 2019, 10 pages.
Notice of Allowance for U.S. Appl. No. 15/078,646, dated Jul. 17, 2019, 11 pages.
Final Office Action for U.S. Appl. No. 14/958,385, dated Aug. 23, 2019, 30 pages.
Feng, Yang, "Solving for the Low-Voltage/Large-Angle Power-Flow Solutions by Using the Holomorphic Embedding Method," Doctoral Dissertation, Arizona State University, Aug. 2015, 220 pages.
Xu, Dan, et al., "Project 32: Optimal Topology Discovery for Automatic Meter Reading Using Powerline Carrier," Part 4 Project Final Report, Department of Electrical and Electronic Engineering, University of Auckland, New Zealand, 2003, 53 pages.
Non-Final Office Action for U.S. Appl. No. 15/395,656, dated Sep. 16, 2019, 14 pages.
Notice of Allowance for U.S. Appl. No. 15/934,499, dated Sep. 25, 2019, 12 pages.
Final Office Action for U.S. Appl. No. 13/896,029, dated Jun. 14, 2019, 21 pages.
Final Office Action for U.S. Appl. No. 15/177,930, dated Jun. 27, 2019, 16 pages.
Applicant-Initiated Interview Summary for U.S. Appl. No. 14/958,385, dated Jun. 11, 2019, 6 pages.
Applicant-Initiated Interview Summary for U.S. Appl. No. 14/958,385, dated Jun. 12, 2019, 5 pages.
Karl, M. et al., "Selection of an Optimal Modulation Scheme for Digital Communications over Low Voltage Power Lines," Proceedings of ISSSTA'95, International Symposium on Spread Spectrum Techniques and Applications, Sep. 1996, Mainz, Germany, IEEE, pp. 1087-1091.
Pimentel, P.R.S. et al., "Revolution in the Distribution (Use of the technology Power Line Communication in the transmission of Data, Voice, and Images," 2004 IEEE/PES Transmission & Distribution Conference & Exposition: Latin America, Nov. 8-11, 2004, Sao Paulo, Brazil, IEEE, pp. 314-320.
Notice of Acceptance for Australian Patent Application No. 2014274664, dated Sep. 2, 2019, 8 pages.
Examination Report No. 1 for Australian Patent Application No. 2018203997, dated Aug. 2, 2019, 4 pages.
Summons to Attend Oral Proceedings for European Patent Application No. 09759619.1, dated Jun. 26, 2019, 8 pages.

(56) References Cited

OTHER PUBLICATIONS

Official Action for Mexican Patent Application No. MX/a/2015/010689, dated Jan. 25, 2019, 6 pages.
Official Action for Mexican Patent Application No. MX/a/2015/010688, dated Jan. 25, 2019, 8 pages.
Examination Report for Australian Patent Application No. 2014274664, dated Feb. 15, 2019, 2 pages.
Examination Report for European Patent Application No. 14810273.4, dated Mar. 21, 2019, 11 pages.
First Office Action for Chinese Patent Application No. 201580059331.5, dated Mar. 5, 2019, 11 pages.
Non-Final Office Action for U.S. Appl. No. 14/958,385, dated Mar. 18, 2019, 24 pages.
Notice of Acceptance for Australian Patent Application No. 2017279752, dated Apr. 12, 2019, 3 pages.
Examination Report for Australian Patent Application No. 2015338943, dated Apr. 5, 2019, 3 pages.
Office Action for Canadian Patent Application No. 2,901,608, dated May 25, 2020, 4 pages.
Office Acton for Canadian Patent Application No. 2,915,072, dated May 1, 2020, 5 pages.
Intention to Grant for European Patent Application No. 09759619.1, dated Apr. 3, 2020, 51 pages.
First Office Action for Chinese Patent Application No. 201580059370.5, dated Apr. 8, 2020, 5 pages.
Examination Report No. 1 for Australian Patent Application No. 2015338896, dated Mar. 30, 2020, 5 pages.

* cited by examiner

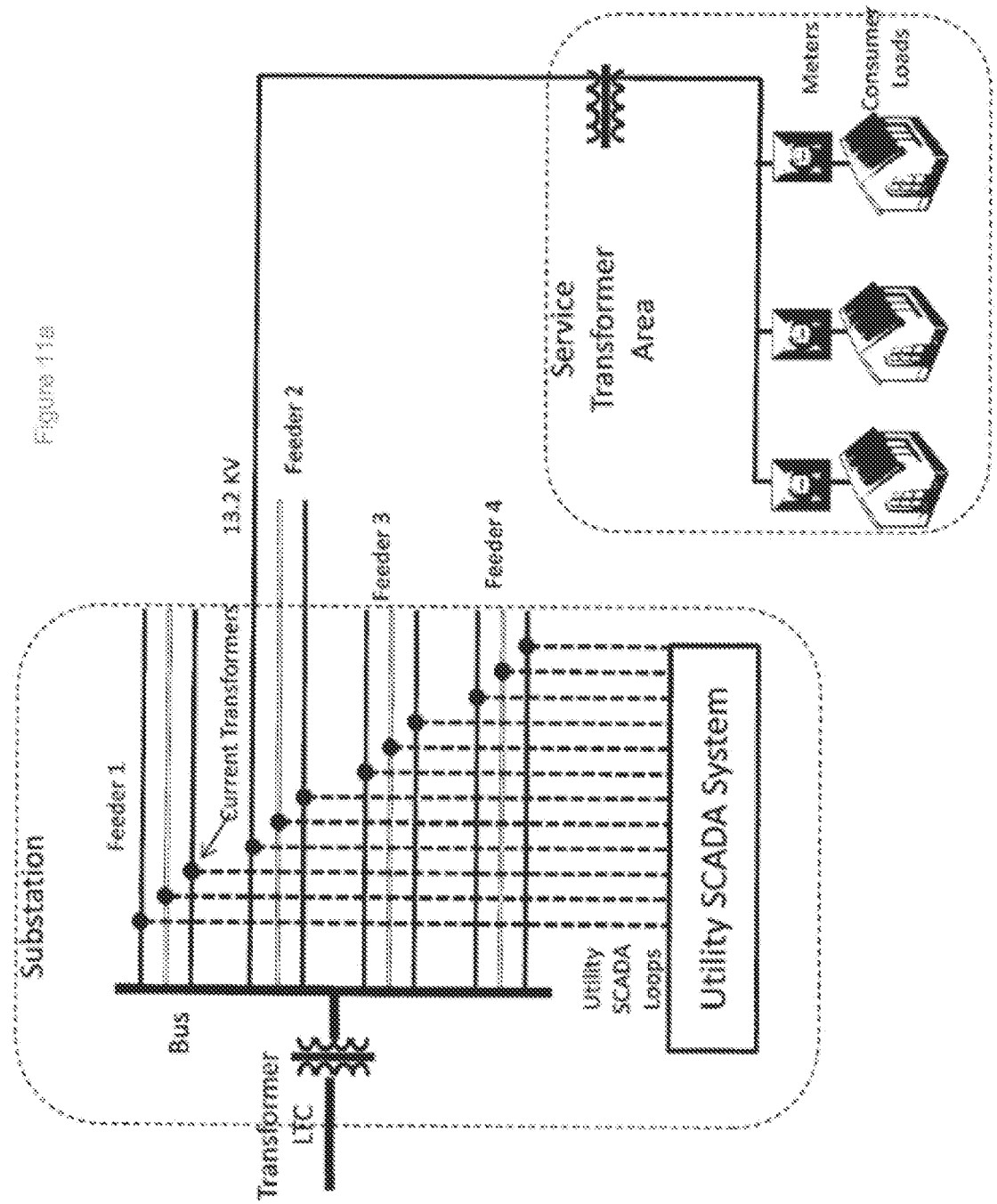

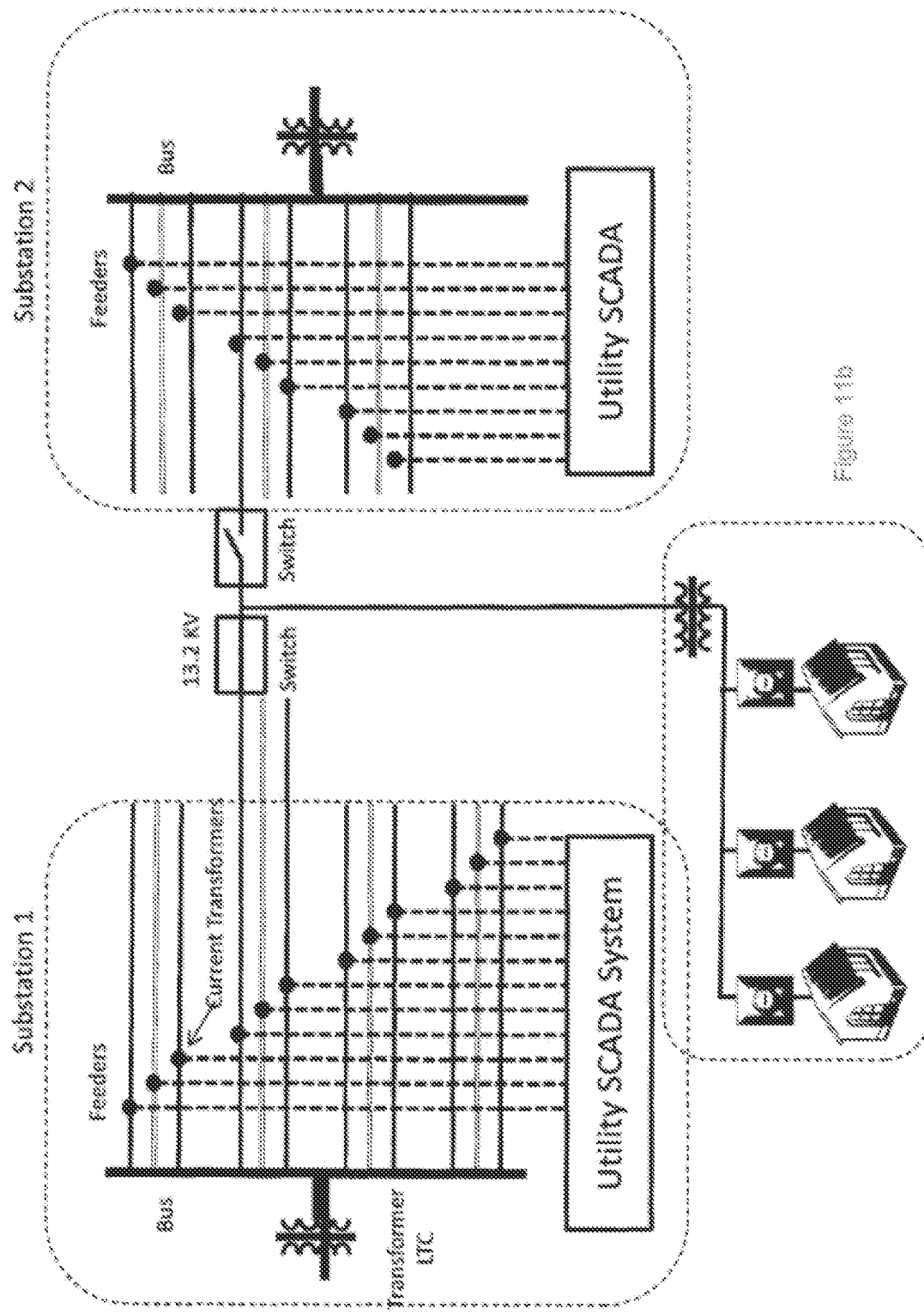

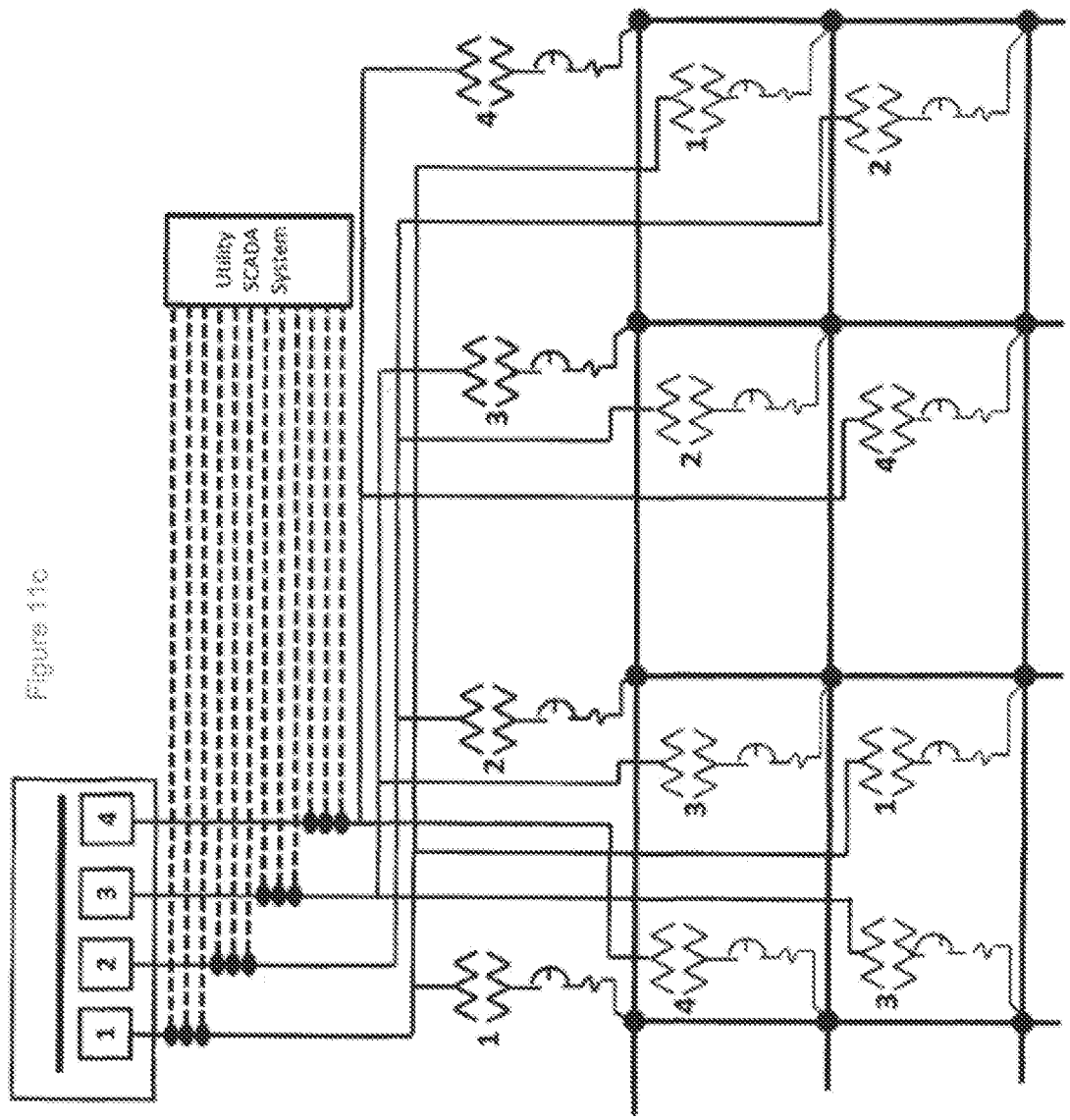

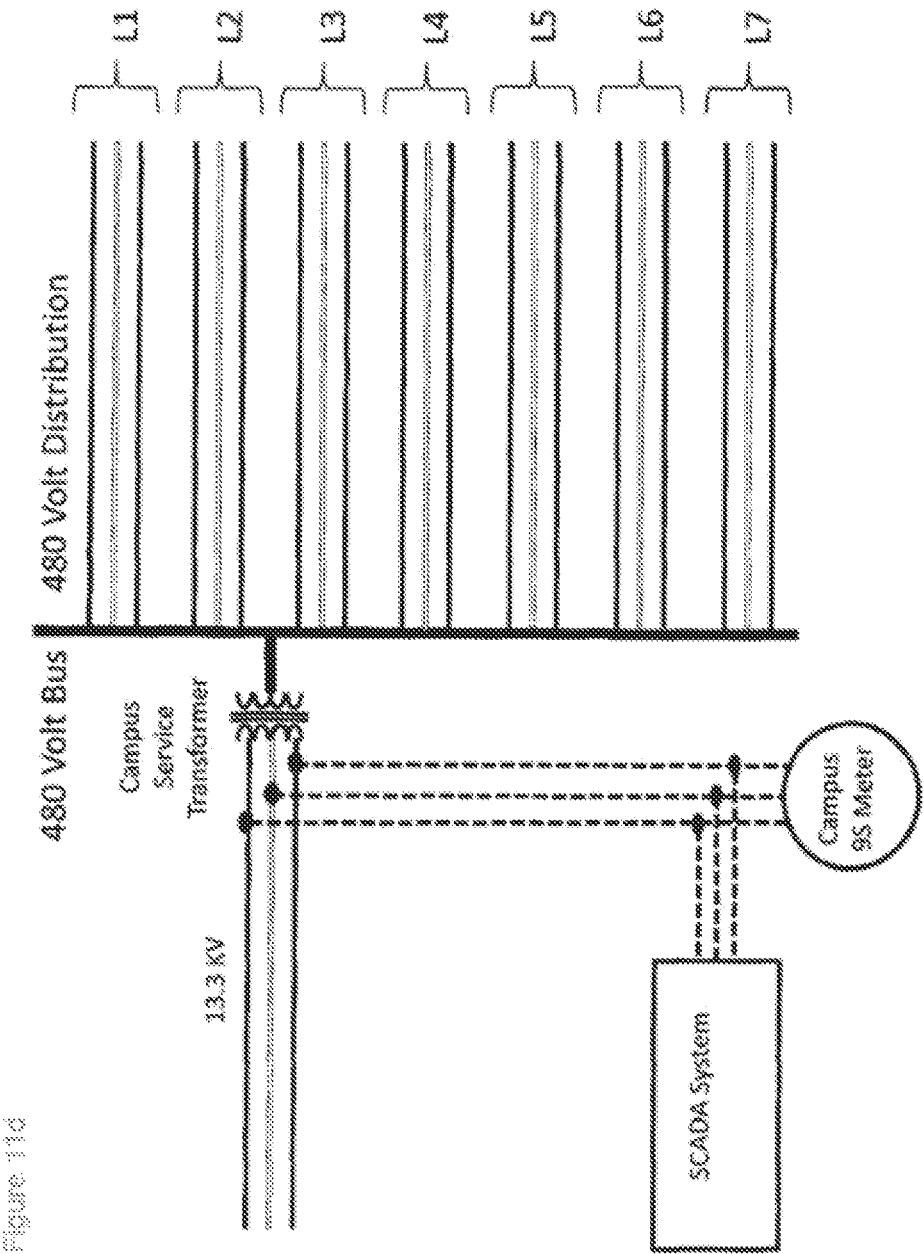

US 10,749,571 B2

SYSTEM AND METHODS FOR INFERRING THE FEEDER AND PHASE POWERING AN ON-GRID TRANSMITTER

CROSS REFERENCE TO RELATED APPLICATIONS

This application claims the benefit of U.S. provisional patent application No. 61/834,573, filed Jun. 13, 2013, the disclosure of which is incorporated herein by reference in its entirety.

FIELD OF THE INVENTION

The present invention is directed toward the use of signals on the electrical distribution grid to infer the feeder and phase powering an on-grid transmitter, and specifically for identifying the path of electricity flow from a substation to a metered load point or other monitored point.

SUMMARY

Electrical Distribution Substations contain one or more Substation Transformers, which step down the voltage from high transmission line levels (typically 130 kV to 700 kV) to the medium voltage levels (typically from 4 kV to about 35 kV, although higher voltages are possible) at which power is distributed to consumers within a distribution service area. At the edge of the Distribution Grid are a number of Service Transformers, which transform the medium voltage of the distribution grid to the low voltages in the US, typically 120, 208, 240, 277, or 480) required for commercial industrial, and residential consumers. Other voltages in addition to some of these can be used elsewhere in the world. Each Service Transformer powers one or more metered loads. A metered load can be a dwelling, a commercial or industrial building, an element of municipal infrastructure such as a series of street lamps, agricultural apparatus such as irrigation systems, or any other metered construct which can draw power from the distribution grid, or combinations of these.

The power grid is generally considered to be composed of two logical regions, the Transmission Grid(s) and the Distribution Grid(s). The Transmission Grid originates at large generation points such as hydroelectric dams, nuclear reactors, wind farms, and coal-fired or gas-fired power plants. Power from the generation point is transmitted as high-voltage alternating current (AC) over a loosely connected network of long, high-voltage lines to points where demand for power exists, such as factories, farms, and population centers. At the edges of the Transmission Grid there is a collection of Distribution Substations. Distribution Substations contain one or more Substation Transformers, which step down the voltage from high transmission line levels (typically 130 kV to 700 kV) to the medium voltage levels (typically from 4 kV to about 35 kV, although higher voltages are possible) at which power is distributed to consumers within a distribution service area. At the edge of the Distribution Grid are a number of Service Transformers, which transform the medium voltage of the distribution grid to the low voltages (in the US, typically 120V, 208V, 240V, 277V, or 480V). Other voltages in addition to some of these can be used elsewhere in the world. In some cases, a tier of one or more transformers, called stepdown transformers, lying schematically between the Substation Transformers and the Service Transformers, create intermediate voltage reductions between the Substation and the Service Transformers. Each Service Transformer powers one or more motored loads. A load can be a dwelling, a commercial or industrial building, an element of municipal infrastructure such as a series of street lamps, or agricultural apparatus such as irrigation systems. A typical distribution grid includes other elements used to balance and regulate the flow of power. Examples of such elements are capacitor banks, voltage regulators, switches, and reclosers. FIG. 10 illustrates a typical segment of the power grid.

Distribution grids have been designed and deployed in a variety of topological configurations, in the United States, distribution grid types are typically characterized as radial, loop, or networked. Other emerging cases are the campus grid and the microgrid. Additional topologies, not described, are used elsewhere in the world.

FIG. 11a topological schematic of a typical radial grid. In a radial grid, a substation has one or more substation transformers. Each substation transformer has one or more substation busses. One or more three-phase feeders "radiate" outward from each substation bus, with single-phase, double-phase, or three-phase lateral lines branching off from the feeders, and tap-off points (or simply "taps") in turn, branching from the laterals. Radial grids are inexpensive to design and build because they are simple, but they are most vulnerable to outages because they typically lack redundant power paths, so that any break causes at least one load to lose power.

FIG. 11b is a topological schematic of a typical loop distribution grid. In a loop grid, each end of select feeders is attached to a power source such as a bus of a substation transformer. If the loop is undamaged, then power is available at all loads if either substation transformer is operational. If there is a break in the loop, then power is available at all loads assuming that both transformers are operational. In normal circumstances, a system of switches is used to ensure that only one substation transformer at a time is delivering power to each segment of the grid.

FIG. 11c is a topological schematic of a typical networked grid. This topology has maximum redundancy. In addition to employing multiple power sources, all the service transformers are linked to one another on the secondary side in a mesh arrangement. Multiple breaks in connectivity are required to cause a power outage at any point. Networked grids are most expensive to build and maintain, and are typically used, in major urban areas such as Manhattan or Washington, D.C. where high-value, high criticality loads are concentrated together.

FIG. 11d shows a microgrid or campus network. Microgrids are not traditional in electrical distribution technology, but are emerging as a response to increased focus on energy conservation and on distributed generation of energy from renewable sources. Many variations are possible. This type of grid is typically attached to, but severable from, a wider distribution grid, and may contain its own power sources such as windmills, solar panels, or rechargeable storage batteries as well as loads. The entire network may employ low-voltage lines.

A distribution substation receives high-voltage power from the transmission grid into one or more large power transformers. A distribution transformer may incorporate a type of regulator called a load-tap changer, which alters the voltage the transformer delivers to a power distribution bus (the substation bus) by including or excluding some turns of the secondary winding circuit of the transformer, thereby changing the ratio of input to output voltage. One or more feeders depend from the substation bus. If too many feeders are required, additional transformers and busses are used.

In order to monitor and control the components of the grid, current transformers (CTs) or other current sensors such as Hall-effect sensors are attached to power-bearing conductors within the substation. The CTs output a low current on a looped conductor which is accurately proportional to the current delivered at the high voltage conductor being monitored. These low-current outputs are suitable for connecting to data acquisition subsystems associated with Supervisory Control and Data Acquisition (SCADA) systems in the substation. Primary monitoring CTs are designed and built into the substation, because changing or adding CTs the high-voltage components is impossible or dangerous while current is flowing. On the other hand, additional CTs may be safely added to the low-current SCADA loops as needed without impacting power delivery.

In addition to the power lines themselves, the distribution grid contains numerous other devices intended to regulate, isolate, stabilize, and divert the flow of power. These devices include switches, reclosers, capacitor banks (usually for power factor correction), and secondary voltage regulators. All these devices affect the behavior of the distribution grid when considered as a data-bearing network, as do the various loads and secondary power sources on the grid. Devices that have abrupt state changes will introduce impulse noise on the grid, as can loads turning on and off. Some devices, such as transformers and capacitor banks, filter and attenuate signals at certain frequencies. Other than the wires connecting a consumer load and the associated meter to a service transformer, the service transformer is typically the outermost element of the distribution grid before the power is actually delivered to a consumer. A meter is typically attached at the point where the power from the service transformer is delivered to the consumer. Service transformers can be three-phase, or single phase, as can meters.

Traditionally, reading meters was one of the largest operational costs incurred by electrical utilities. Originally, electric meters were analog devices with an optical read-out that had to be manually examined monthly to drive the utility billing process. Beginning in the 1970s, mechanisms for digitizing meter data and automating its collection began to be deployed. These mechanisms evolved from walk-by or drive-by systems where the meter would broadcast its current reading using a short-range radio signal, which was received by a device carried by the meter reader. These early systems were known as Automated Meter Reading systems or AMRs. Later, a variety of purpose-built data collection networks, commonly employing a combination of short-range RF repeaters in a mesh configuration with collection points equipped with broadband backhaul means for transporting aggregated readings began to be deployed.

These networks were capable of two-way communication between the "metering head-end" at a utility service center and the meters at the edge of this data collection network, and are generally called an Advanced Metering Infrastructure or AMI. AMIs can collect and store readings frequently, typically as often as every 15 minutes, and can report them nearly that often. They can read any meter on demand provided that this feature is used sparingly, and can connect or disconnect any meter on demand as well. AMI meters can pass signals to consumer devices for the purpose of energy conservation, demand management, and variable-rate billing. Because the AMI network is separate from the power distribution grid except for the intersection at the meters, AMI meters are neither aware of nor sensitive to changes in the grid topology or certain conditions on the grid. Nonetheless, the introduction of AMI is often the first step in the direction of a true Smart Grid implementation.

AMI networks generally do not have all the capabilities required to support Smart Grid applications over and above meter reading and demand management. Significantly, the AMI network usually does not use the electrical grid as a transmission medium. It monitors only the metered load points, and hence does not detect electrical changes and conditions elsewhere on the distribution grid. Further, data-carrying capacity from the edge to the central concentrators is typically adequate for meter data and little more.

Sophisticated Smart Grid applications for energy conservation, asset protection, non-technical loss detection, load balancing, fault isolation, and recovery management require accurate information about the schematic relationship of grid assets, load and conditions on the several segments of the grid, and the current state of bi-modal and multi-modal assets. This information, together with the geospatial locations of the same assets, is called a grid map and is typically stored in a database. In general, AMI networks do not have the sensor mechanisms, monitoring capability, or the bandwidth to provide these types of information, with the result that present-day grid map databases are seldom updated in real time.

Utilities typically maintain two maps or models of the distribution grid. A Physical Network Model (PNM) aggregates the geospatial location of the assets on the grid. PNMs, thanks to modern GPS technology, are reasonably accurate with respect to point assets such as substations, capacitor banks, transformers, and even individual meters, although the accuracy of this information typically diminishes the further out on the distribution grid the assets are located, or diminishes inversely as a function of the value oldie asset, or diminishes directly as a function of the frequency a given asset is accessed. Inaccuracies stem from failure to update the maps when repairs or changes are made, and includes both intentional and unintentional changes. For example, a service transformer may move, from one side of a street to the other as a result of street widening. Such a move may additionally result in a change in the partitioning of metered loads among the service transformers in an area.

Longitudinal assets, especially buried cables, are less well represented in the PNM. The PNM can contain as-designed data regarding the location of the longitudinal assets, but since in many places the cable was laid before global positioning technology had matured, the designs were based on ground-level survey, and the original maps may or may not have been updated to reflect changes. Therefore, the location from the as-designed data may be inaccurate, and subsequent surface changes complicate the problem of verifying the geographic path taken by medium-voltage and low-voltage, distribution lines.

The second model is the Logical Network Model, or LNM. LNMs describe how grid components are connected, without reference to their geospatial location. The LNM changes frequently. During the course of repairs, the way transformers attach to taps and laterals, and the way meters attach to transformers, may be altered. Such changes may affect both the LNM and the PNM. In many utilities, such intentional changes are recorded manually by field agents. The manual reports may or may not be updated in the LNM and PNM, and when updates are made the time lag between maintenance occurring and its being recorded could be significant. The problem is exacerbated by unintentional changes implemented automatically by automated but non-monitored switching elements and devices such as reclosers.

The fundamental problem of grid schematic mapping therefore involves determining what substation, bus, feeder, and phase powers a particular meter or other monitoring point.

While the aforementioned issues are themselves complex, the wiring at the periphery of the electrical distribution grid (i.e., the wiring, from the service transformer to an electrical meter or meters) significantly adds to the difficulty of effecting grid schematic mapping. This wiring can have a radial topology, as is common in the US, or it can have a linear or "bus" topology, as is more common in Europe. Elsewhere in the world one can find both radial and bus topologies. In locales where transformers are mounted on poles and tap lines are above ground, one might think this wiring would be obvious. However, in those locales, it is very easy after an outage caused by a storm, a traffic accident, or scheduled construction, for repairs to be made, in such a way as to change the transformer to which a meter is attached. In dense neighborhoods it is not always apparent how bundled and criss-crossing power lines connect buildings to transformers, especially when multiple transformers are attached to one pole.

In cases where transformers are pad-mounted or underground, and taps run underground, the construction may pre-date grid mapping. In that case, the only data that may be available are schematic designs made by survey. In general, no reliable record exists of whether this wiring was built strictly according to specification, or what has been the effect of subsequent modifications.

Practical benefits of having accurate distribution circuit maps include, but are not limited to, reductions in losses in the grid, load and phase balancing, reduced outage time, improved reliability, improved safety, asset protection, trend determination, and theft detection. It would be desirable to have a system that can provide real-time or near-real-time information that allows utilities to accurately determine distribution schematic information.

U.S. patent application Ser. No. 13/871,944, titled "A System and Method for Inferring Schematic and Topological Properties of an Electrical Distribution Grid" and incorporated herein by reference in its entirety, teaches an on-grid transmitter which may transmit a Probe Transmission consisting of a sequence of pure tones of different frequencies or one or more sequential groups of a combination of two or more pure tones transmitted simultaneously. The transmission is made by injecting current onto a low-voltage power line at an electrical meter or other low-voltage, access point. The application further teaches an on-grid receiver located at an electrical distribution substation or other medium-voltage access point, the receiver being configured to monitor all three phases of one or more medium voltage feeders. The receiver continuously digitizes and records the signal on all monitored power lines, sampling the recorded signal attempting to recognize a probe transmission. Because of the physical characteristics of the electrical grid, a Probe Transmission which was injected on exactly one phase of one feeder may be detected and recognized on one or more of the monitored power lines. The receiver knows a priori the phase of each monitored line and the schematic identity of the feeder to which it belongs. The receiver also knows the frequency, grouping, and duration of the tones in a Probe Transmission. The transmitter is not aware of its feeder-phase identity. One task of the receiver is to infer the phase and feeder on which the transmitter injected the Probe Transmission, regardless of the number of monitored lines an which the transmission was recognized.

If a Probe Transmission is detected on only one monitored line, then that line may be assumed to reflect the feeder and phase of the transmitter. However, if a Probe transmission is detected on more than one monitored line, then it cannot be assumed that the lines reflect the feeder and phase of the transmitter. Therefore, it would be desirable to be able to determine feeder and phase of a Probe Transmission in more than one monitored line.

BRIEF DESCRIPTION OF THE DRAWINGS

The accompanying drawings, which are incorporated in and form part of the specification, illustrate embodiments of the invention and, together with the description, serve to explain the principles of the invention. In the drawings:

FIG. 11a is a simplified fragment of a radial-architecture distribution grid showing the lack of cycles in the grid topology.

FIG. 11b is a simplified fragment of a looped-architecture distribution grid depicting two substations each able to deliver power to the service transformer delivering low-voltage power to the group of residences shown. The substation at left is currently powering the residential group.

FIG. 11c is a simplified fragment of a networked architecture distribution grid. The four feeders shown could originate at a single substation (typical) or at multiple substations. The rectangular grid connects service transformers peer-to-peer on the low voltage side so that all feeders deliver power to the loads below the substations concurrently.

FIG. 11d is an exemplary simplified fragment of a campus network, A three-phase transform powers a 480 volt bus from which depend a number three-phase laterals which run through the campus powering individual electrical outlets. Adding low-voltage generation points to the bus and providing means to isolate the bus from the distribution line converts the campus network into a self sufficient microgrid.

DETAILED DESCRIPTION OF THE INVENTION

In the following detailed description, reference is made to the accompanying drawings, which form a part hereof, and in which is shown by way of illustration specific exemplary embodiments of the invention. These embodiments are described in sufficient detail to enable those of ordinary skill in the art to make and use the invention, and it is to be understood that structural, logical, or other changes may be made to the specific embodiments disclosed without departing from the spirit and scope of the present invention.

The present invention discloses a method of inferring a feeder and phase of a transmitter when a Probe Transmission is detected on two or more monitored lines.

Figure 5:
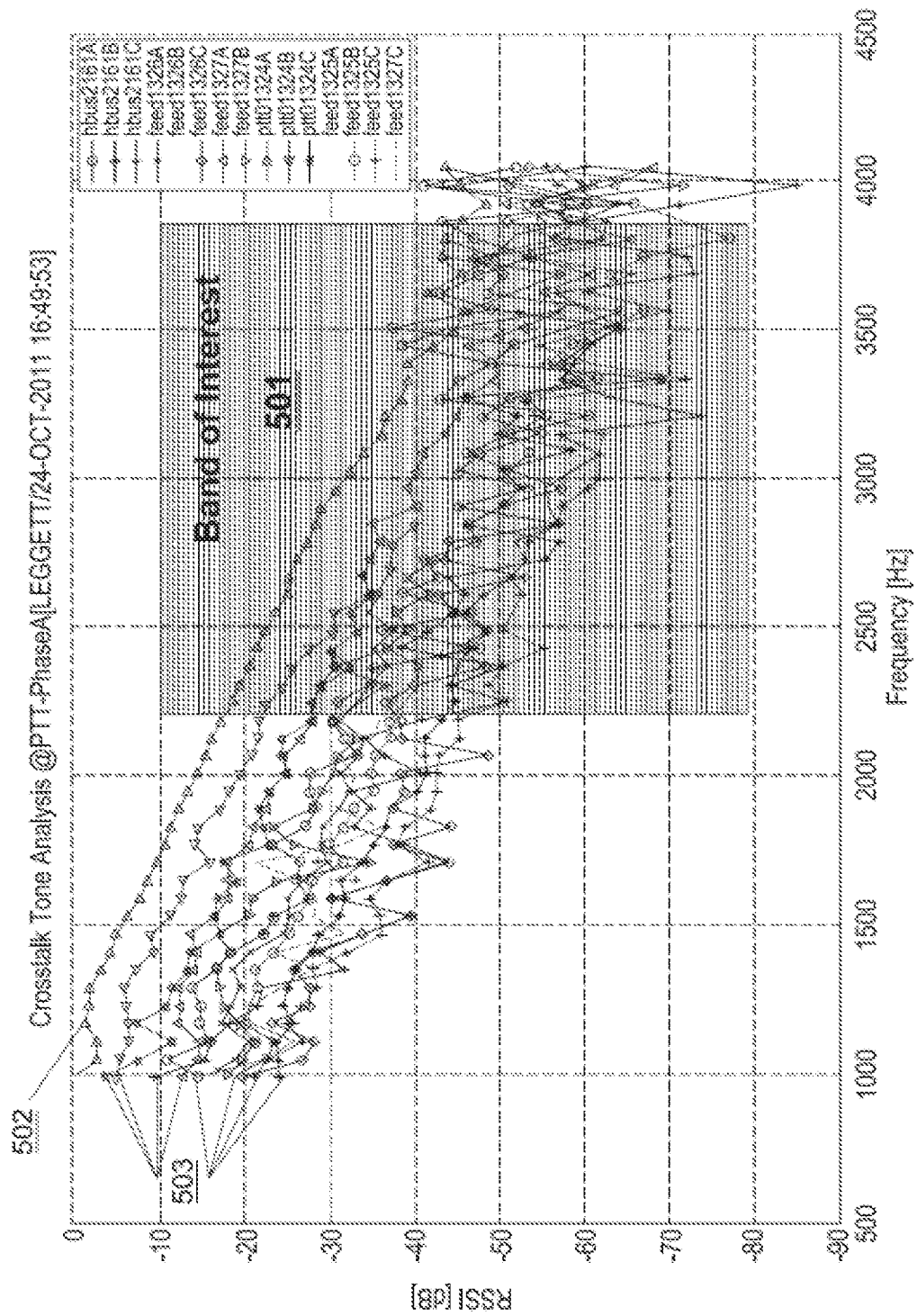
FIG. 5 is a graph depicting the difficulty of inferring the grid location of a low-voltage transformer by detecting the signal injected by the transmitter at a substation. The graph shown in FIG. 5 was created by injecting a low-voltage signal on one phase of one feeder of An electrical distribution substation having a total of five feeders.

FIG. 5 illustrates the difficulty of inferring the grid location of a low-voltage transformer by detecting the signal injected by the transmitter at a substation. The graph shown in FIG. 5 was created by injecting a low-voltage signal on one phase of one feeder of an electrical distribution substation having a total of five feeders. The signal was a "sweep," increasing continuously in frequency from 1 KHz to 4 KHz. A receiver at the substation monitored all fifteen power lines (three phases each of five feeders) to record the Received Signal Strength (RSSI) of the sweep frequencies. Data set 502 represents the RSSI of the sweep on the feeder-phase of the transmitter. Data sets 503 represent the RSSIs of the sweep as received on all fourteen of the other feeder-phase lines at the substation. The sweep was detectable on all fifteen lines. Although described with respect to a sweep, the invention is not so limited. This phenomenon is called crosstalk or crossover. As expected, the signal on the line of injection was stronger than the other signal over most of the frequency band of interest 501. Note, however, that the signal strength of the crossover received signals does not diminish smoothly as frequency increases, and that at some frequencies the crossover signals are actually stronger than the signal on the line of injection. Repeated measurements show that the amplified frequencies do not remain consistent on the same distribution grid over time, nor is the behavior of every distribution grid the same. Thus, identifying the line of injection when it is not known becomes a non-trivial problem.

Figure 1:
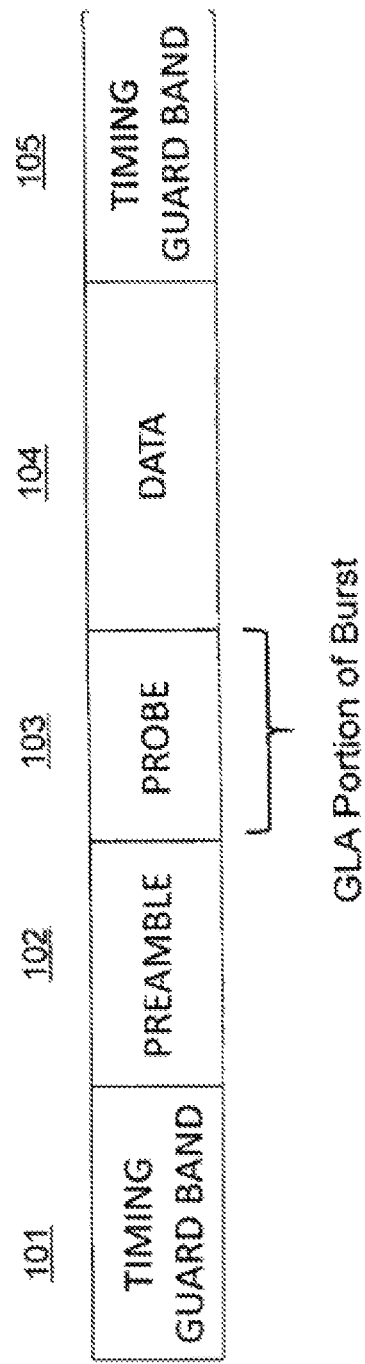
FIG. 1 is a view of an exemplary structure of a single on-grid transmission.
Figure 2:
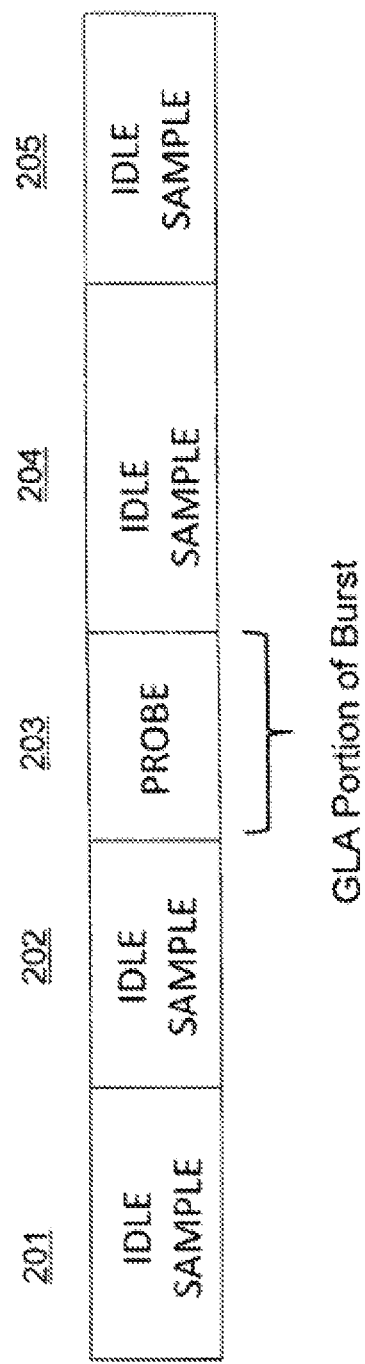
FIG. 2 is a view of another exemplary structure of a single on-grid transmission.

FIGS. 1 and 2 illustrate two examples of a number of possible patterns (as disclosed in U.S. application Ser. No. 13/871,944) of an on-grid transmission in a grid-location aware ("GLA") network. FIG. 1 shows an exemplary data-bearing transmission, comprising a preamble 102, a probe transmission 103, and a data segment 104. The message is preceded and followed by timing guard bands 101 and 105, respectively, in which not only does this on-grid transmitter refrain from transmitting, but in which, in a preferred approach, no on-grid transmitter powered by the same substation or substations is permitted to transmit. The probe transmission 103 is, in an approach, the GLA portion of the transmission. FIG. 2 shows an exemplary on-grid transmission that includes a probe transmission 203 made only for the purpose of inferring the grid location of the transmitter. In the structure of FIG. 2, the probe transmission 203 is, in an approach, the GLA portion of the transmission. Similarly, one or more idle sampling periods such as 201, 202, 204, and 205 may precede and follow the GLA portion of the transmission. Although only two on-grid transmissions are shown, the invention is not so limited and there can be many different on-grid transmissions applied to carry-out the invention.

To infer the grid location of a transmitter, a receiver located at a substation or other junction point on the distribution grid, monitors all phases of at least one feeder whereon knowing the grid location of the transmitters is required. In a preferred approach, a transmitter is a special or general purpose computer having at least a processor and a computer readable memory. A transmitter also includes appropriate circuitry for transmitting signals and a receiver includes appropriate circuitry for receiving signals. A transmitter is typically an End-Point transmitter. In a preferred approach, a receiver or sensor is a special or general purpose computer having at least a processor and a computer readable memory. A receiver is typically a substation receiver. It is preferable but not required that all feeders of a particular substation transformer are monitored. The receiver digitizes and records the waveforms on each monitored power line (i.e., a phase of a feeder), recording both transmissions and idle periods. In an exemplary situation where a transmission like the structure of FIG. 1 is applied, the receiver records sections 101, 102, 103, 104, and 105, although other approaches to recording the transmission can be applied. In an exemplary situation where a transmission like the structure of FIG. 2 is applied, the receiver might record sections 201, 202, 203, 204, and 205. In an approach, the receiver records continuously. In another approach, the receiver records using policy information at its disposal to record only around intervals where transmissions are expected.

In one embodiment of the invention, the receiver samples each line as it records, attempting, to recognize a Preamble 102 or a Probe Transmission (103, 203). When a transmission is recognized by means of a Preamble or a Probe Transmission being identified, recording continues at least until sufficient idle time has been collected. The receiver then extracts significant frequency/amplitude samples from the recording and conducts a "voting" process as follows. The significant frequencies are called tone frequencies, because each such frequency is transmitted as a pure tone in the Probe Transmission. The amplitude (or RSSI) at each tone frequency reflects the energy of the received signal.

In an exemplary voting process when a FIG. 2 structure is being transmitted:

1. Each section of the recording (e.g. 201,202,203,204, 205) is processed to determine the energy at each tone frequency that is seen in each section. The number and duration of idle samples that may be recorded is variable; there is at least one.

2. For each tone frequency, an average of the energy of the idle samples is subtracted from the energy in the Probe Transmission 203.

3. The magnitude of the energy at each frequency is compared across all monitored feeder-phase lines.

4. The monitored line (feeder-phase) with the most tone frequencies with the maximum energy is termed the device's grid location.

5. In the case of a tie in the number of maximum energy levels, the sum of the magnitudes of the energy seen at the frequencies which were highest on each tied line is computed. Recall that the number of addends will be the same for each tied line, because that is the definition of a tie. The line with the highest summed energy is then determined to be the device's grid location.

In a preferred approach, data-bearing sections of the transmission, such as preamble 102 and data 104, are not included in the measurement, because in these sections, energy may be injected by the transmitter, but not in a consistent or predictable way. Hence, these sections are less useful for determining the "background" energy of the line. Note also that tone frequencies are selected so as to avoid the harmonics of the power fundamental.

In a preferred approach, if a transmitter is capable of always beginning to transmit at the zero-crossing of the power fundamental at the point of transmission, then a check on the method described above is possible.

Figure 3:
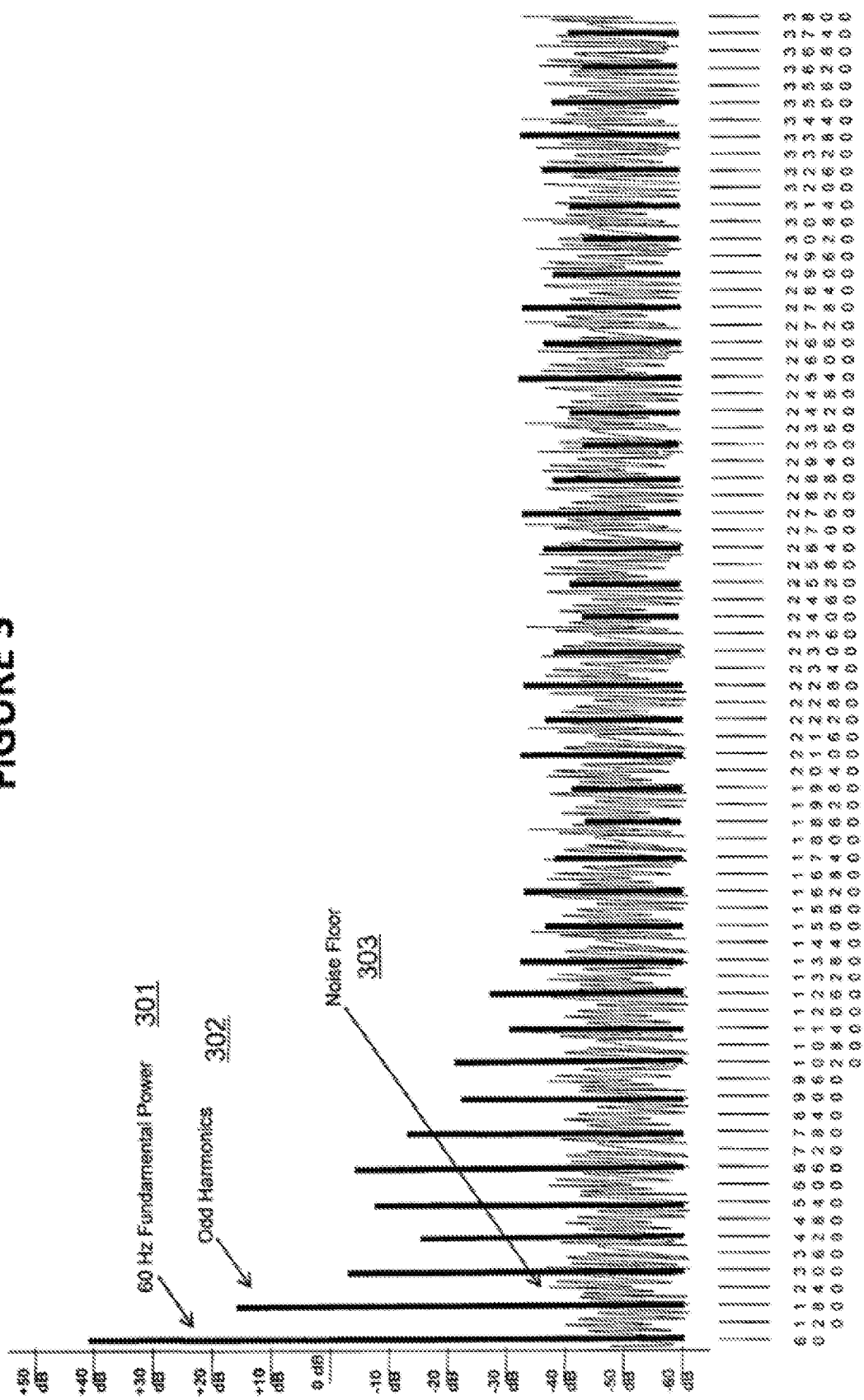
FIG. 3 is a graph (not to scale) of a snapshot of the AC waveforms on a distribution grid at a substation. The power fundamental and its odd harmonics are highlighted.

FIG. 3 illustrates both the characteristics of the tow end of the frequency spectrum on a feeder-phase line of a typical distribution grid. Important characteristics of the spectrum are the 50 Hz or 60 Hz power fundamental 301, its harmonics 302, and the noise floor 303, it should be noted that from time to time a spike of impulse noise may exceed the usual noise floor. The defined channel or channels for modulated signals transmitted by an Edge Transmitter occupy a broad candidate spectrum lying between the 50 or 60 Hz power fundamental and the low-pass threshold of the service transmitters on the host power grid. The candidate spectrum for a particular substation is determined by measurement and set by policy and subject to regulatory constraints. Measurements determine which band or bands of the candidate spectrum are reliably received at each substation transformer. If a usable band is wider than the bandwidth needed for a reliable transmission, then the channel band may be defined to be variable. In such cases, the Remote Huh conducts measurements, described herein below, prior to transmitting to determine at present conditions which part of the wider channel is currently most favorable for transmitting. Conversely, at a Receiver located at a substation, the preamble detector samples the entire wide usable band, determining the actual band used by the transmitter based on where the preamble was detected. The location of a receiver can provide significant information about the circuitry providing the power flow.

Figure 4:
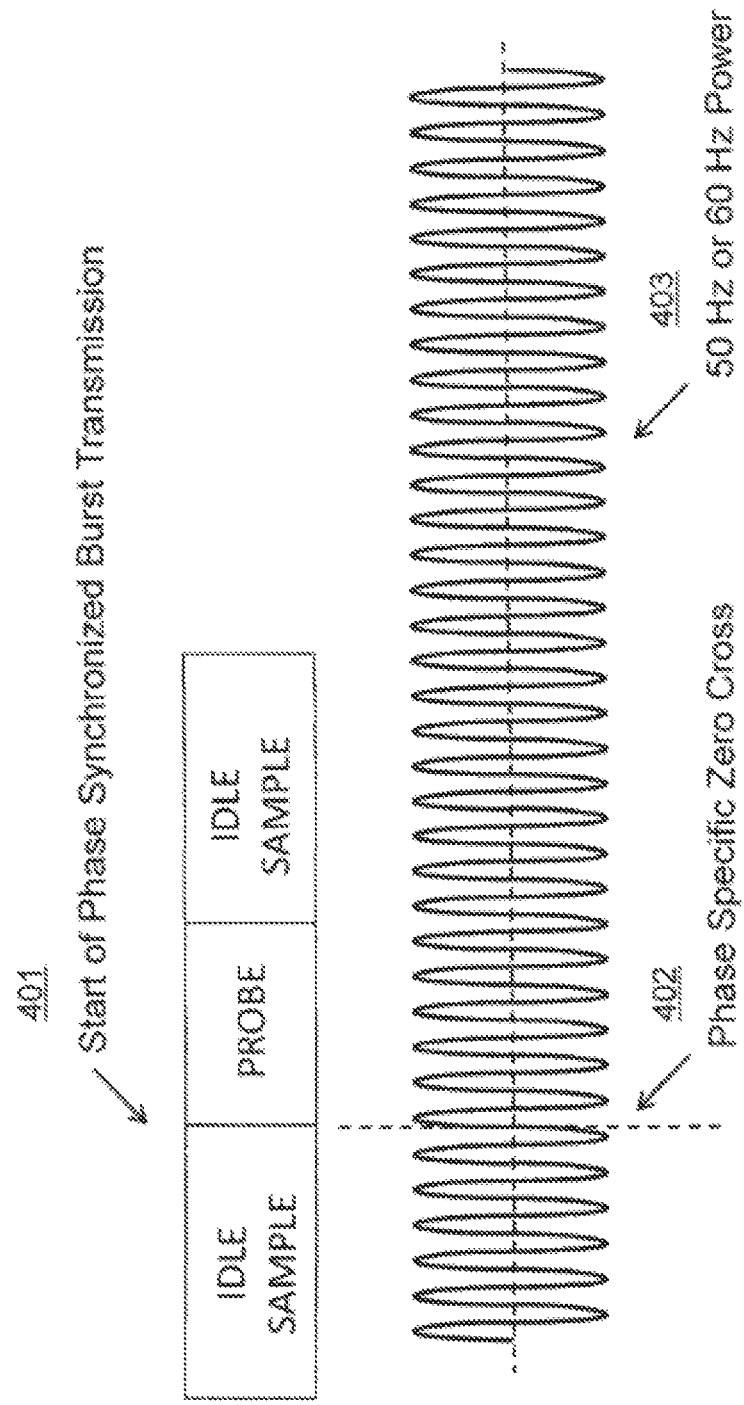
FIG. 4 is an exemplary view of a check on the voting process and shows a probe transmission beginning on the phase-specific zero crossing point of power fundamental.

Refer to FIG. 4, which Shows an exemplary check on a voting process, and includes probe transmission 401 beginning on the phase-specific zero crossing point 402 of power fundamental 403. Since the three phases of a feeder are 120 degrees out of phase, it is possible to determine the phase location of the transmitter based on the timing relation of its transmission with the feeder/phase line that is measured at the receiver. If two or more lines are tied with respect to the energy-based method, then the tied line which is in phase with the transmission is selected as the device's grid location. The phase of a transmission may be determined exclusively by the latter method, but without measurements of the RSSI there is no indication of the feeder of transmission.

Another check on the voting algorithms disclosed above may be the burst demodulation performance across all feeder-phases. For example, the data segment of a message, such as 104, may contain forward error correction ("FEC") or cyclic redundancy check ("CRC") information. When the most energetic received message, or one of the most energetic in case of a tie, has bit errors in the data segment of the message, or in the preamble, then it is possible that the energy "vote" has been distorted by impulse noise on one of the tone frequencies.

Additionally, in an approach, a data-bearing message may contain other information related to the grid location of the transmitter. Specifically, the data section may contain the identity of the transmitter. If the receiver has access to a stored grid-map database, then a current inferred grid location of a transmitter may be compared with a previous inferred or known grid location of the same transmitter, and this may be used to inform the decision about the outcome of the inference. Grid locations of devices at the edge of the grid do change from time to time, because of repairs, additions to the grid, changes in the switch states of features of the distribution grid, and the like. However, it may be possible to determine the likelihood of such a change having occurred from the grid map, or the inconsistency may become input to a situational analysis process.

Figure 6:
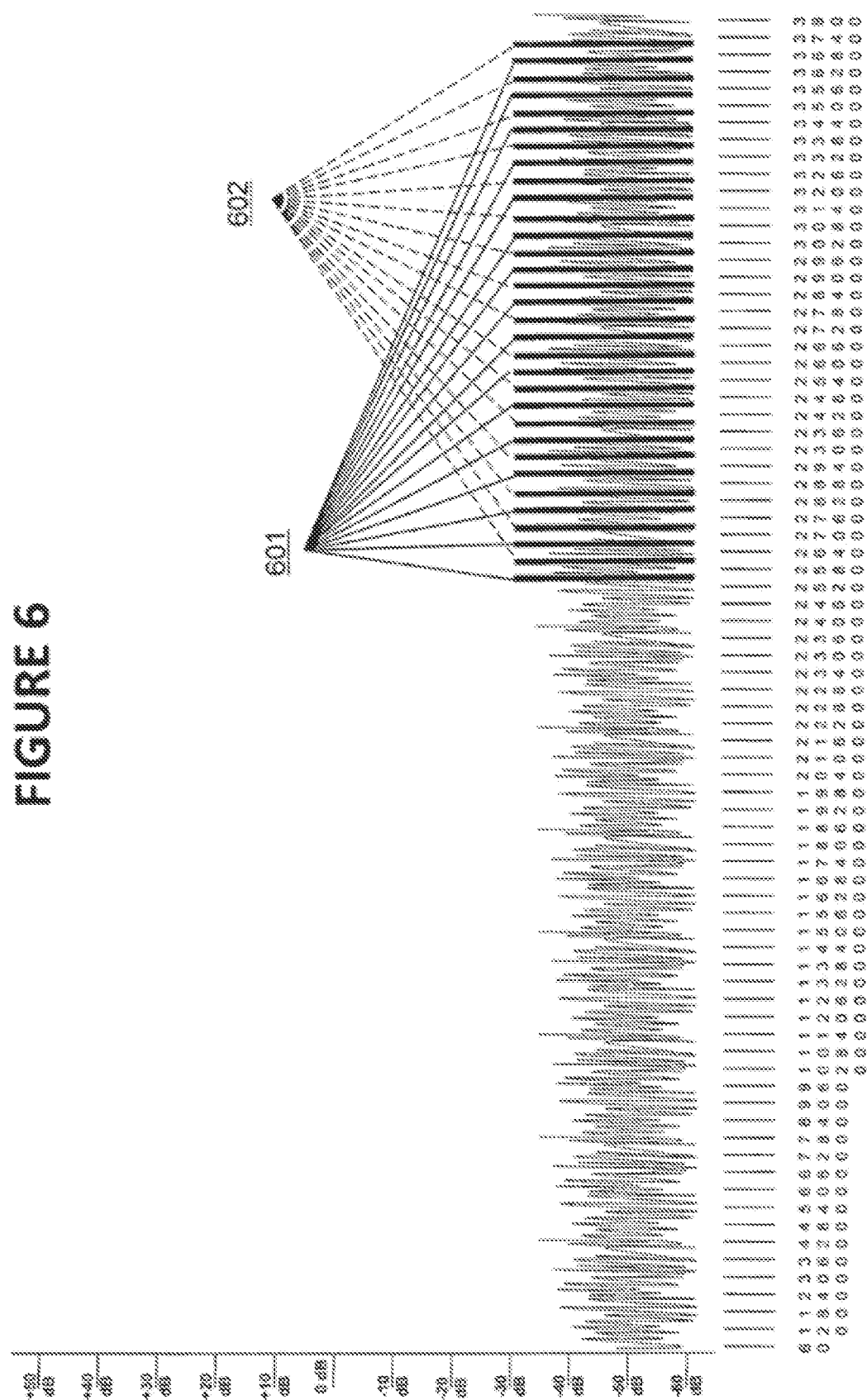
FIG. 6 is another exemplary method of applying a voting method.

Refer now to FIG. 6, which illustrates a more compact method of implementing the voting method disclosed above. In this method the Probe Transmission contains at least two tone groups, which are transmitted one group after another in sequence. The sequence may repeat. The sequence, in a preferred approach as always, is known to the receiver. Suppose that a Probe Transmission consists of two frequency tone groups, 601 and 602, which are transmitted in sequence, Instead of measuring one or more idle sections, as disclosed above, the receiver monitors only the probe frequencies. While tone group 601 is present, the frequencies of tone group 602 are also measured and used in lieu of an idle section. While tone group 602 is present, the frequencies of tone group 601 are also measured and used in lieu of an idle section. The algorithm then proceeds as described herein above.

Figure 7:
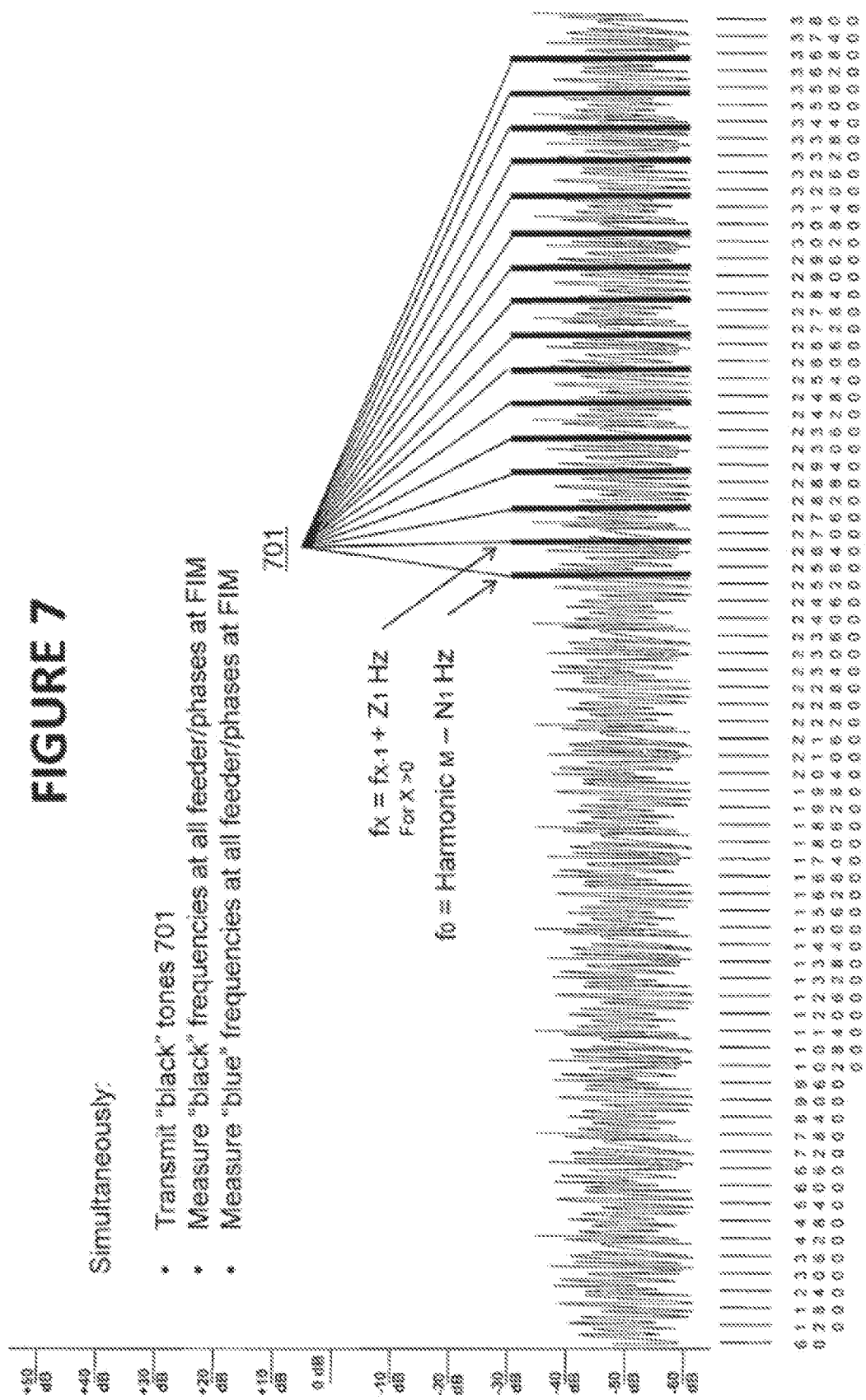
FIG. 7 is an example of a tone group providing idle frequencies while another tone group is being transmitted.
Figure 8:
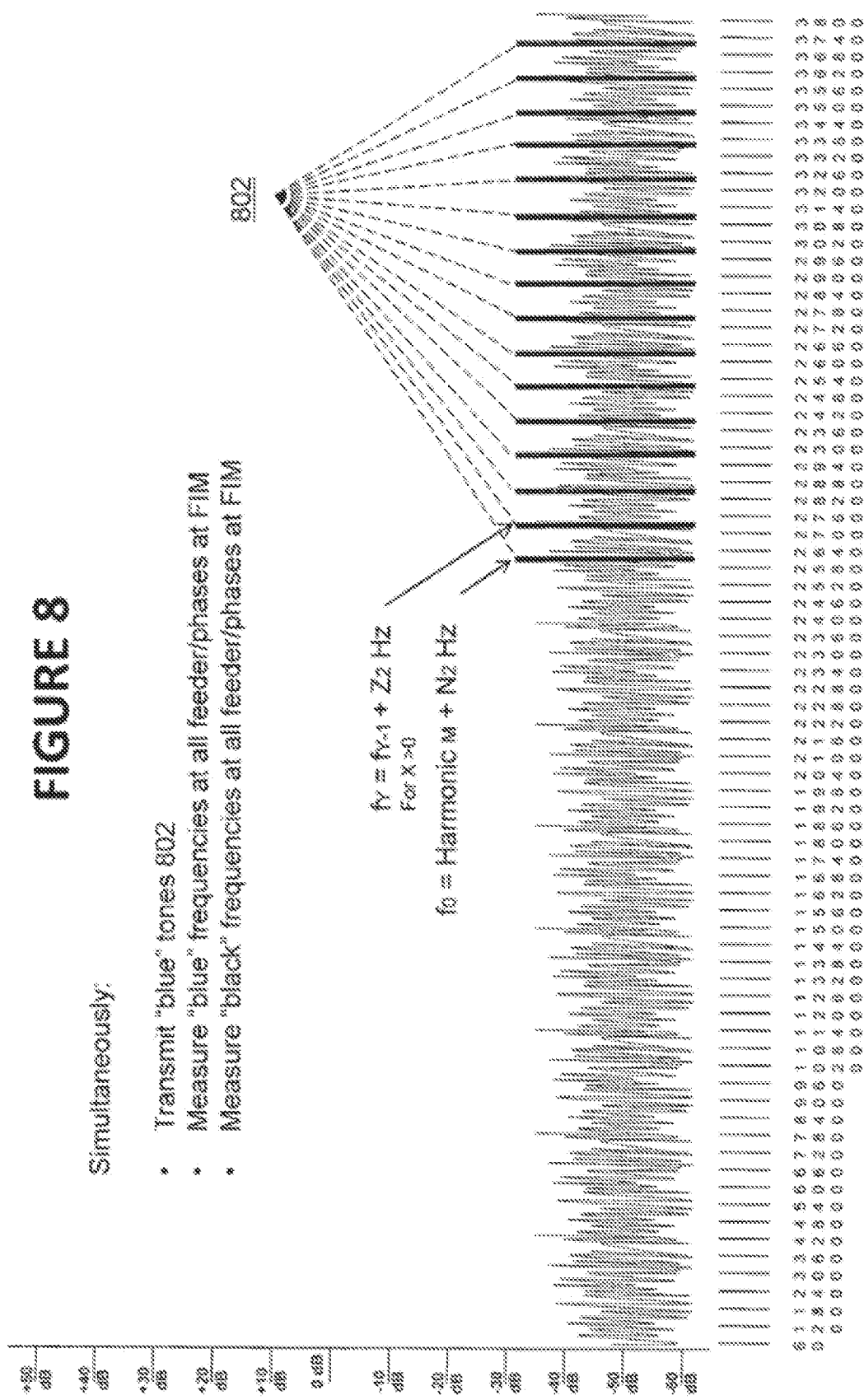
FIG. 8 is another example of a tone group providing idle frequencies while another tone group is being transmitted.

FIGS. 7 and 8 illustrates how the frequencies of one tone group provide idle frequencies while the frequencies of the other tone group are transmitted. FIGS. 7 and 8 are graphs of the frequency spectrum, e.g., from 60 hertz to 3800 hertz, where data points are plotted against loudness, e.g. from −60 dB to +50 dB. In FIG. 7, the heavy bars connected to lead lines 701 represent a set of tones (black tones), e.g. one tone group. The other plotted data points (blue tones) on the figure represent noise, e.g., background noise on the system. The tone group is compared to the background noise. In FIG. 8, the heavy bars connected to lead lines 802 represent a set of tones (blue tones), e.g., one tone group, where this tone group is different than the tone group of FIG. 7. The other plotted data points (black tones) on the figure represent noise, e.g., background noise on the system. The second tone group is compared to the background noise.

Figure 9:
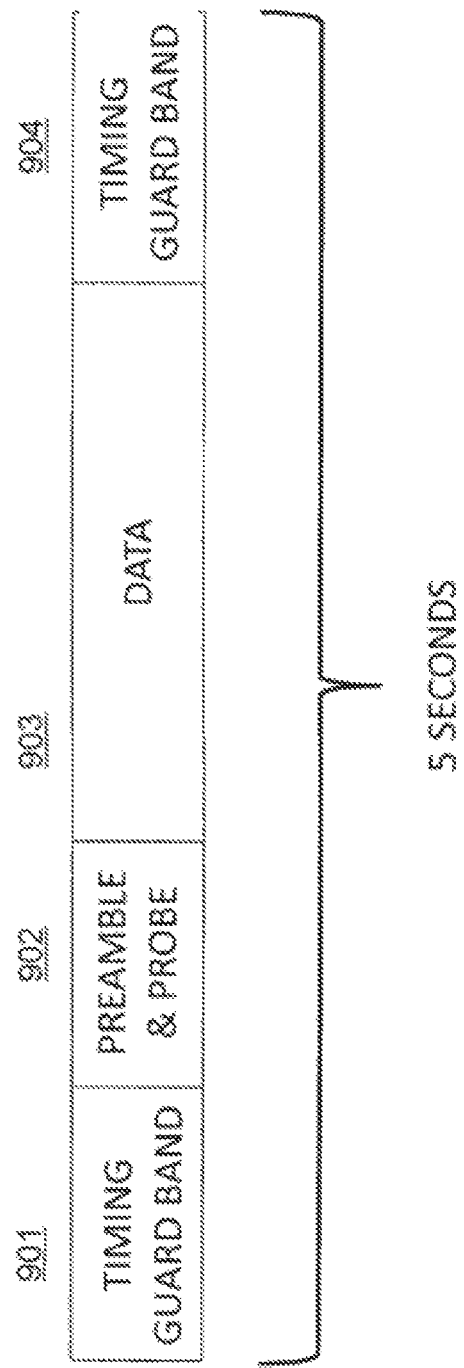
FIG. 9 is a view of yet another exemplary structure of a single on-grid transmission.
Figure 10:
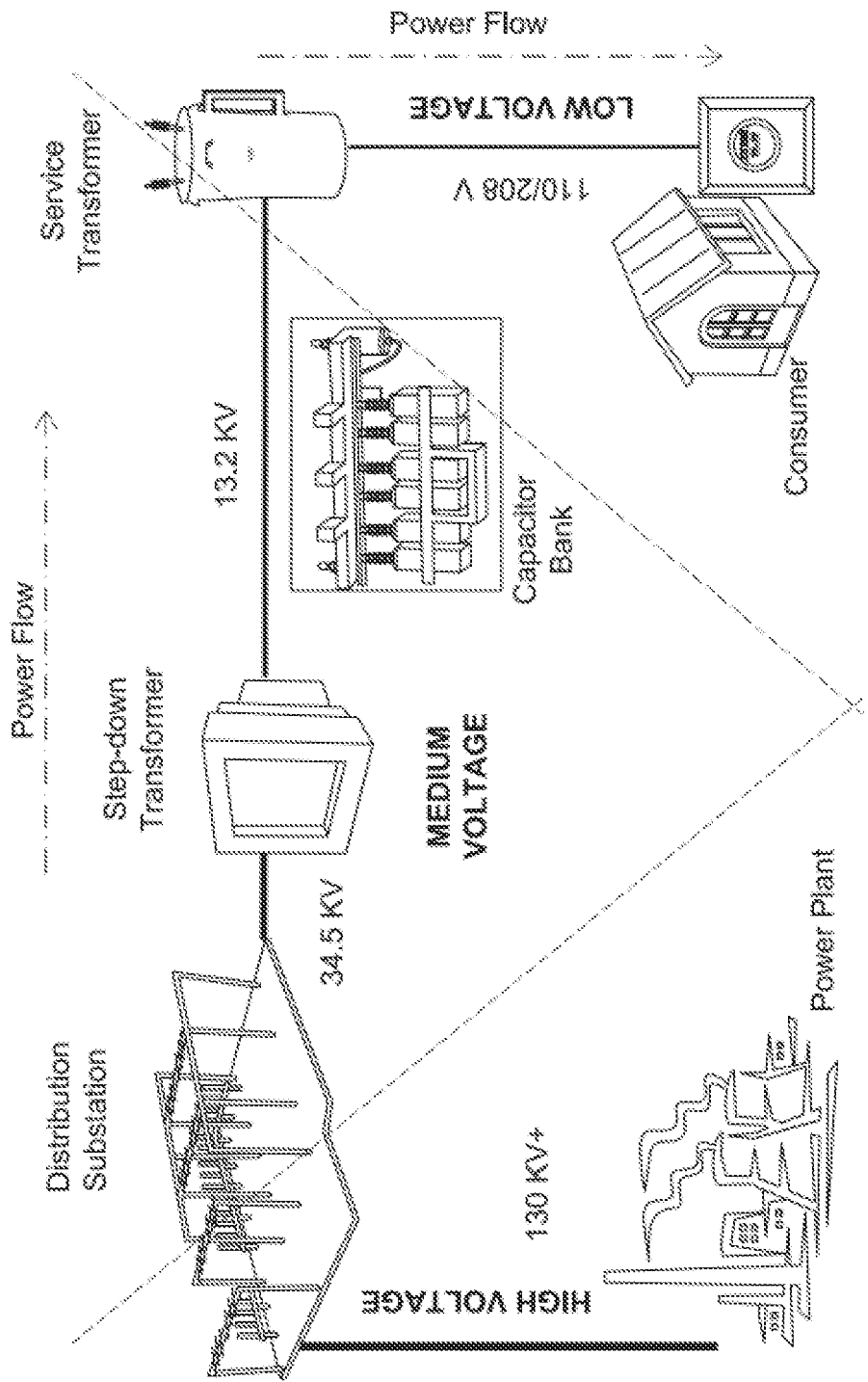
FIG. 10 is a simplified illustration of the power path from a generation point to a distribution substation to a consumer, showing the high voltage, medium voltage, and low voltage regions of the distribution grid and depicting some of the major features of an electrical distribution grid.

Also consider an exemplary message format of FIG. 9 which includes timing guard bands 901 and 904, a combined preamble and probe section 902, and a data section 903, In this embodiment, the message preamble and the probe transmission are one and the same. Pure tones occur in the preamble, but a modulated identifier of known pattern may be superimposed. The compact voting method of FIGS. 6, 7, and 8 may or may not be applicable depending on whether the pattern provides sufficient idle samples. The method of using the timing guard bands (901,904) to provide the idle samples will be applicable.

While the invention has been described and illustrated with reference to specific exemplary embodiments, it should be understood that many modifications, combinations, and substitutions can be made without departing from the spirit and scope of the invention. Accordingly, the invention is not to be considered as limited by the foregoing description bat is only limited by the scope of the claims.

What is claimed as new and desired to be protected by Letters Patent of the United States is:

1. A method of determining a phase line on which a transmitter is transmitting, comprising:
   receiving, by a receiver communicatively coupled to a plurality of power distribution phase lines, a signal on each phase line of the plurality of phase lines of a plurality of feeder lines due to crosstalk, each feeder line of the plurality of feeder lines comprising a subset of phase lines of the plurality of phase lines, the signal comprising a plurality of tone frequencies, and the signal being generated by a transmitter that transmits the signal on a particular phase line of the plurality of phase lines;

determining, by the receiver, for each respective phase line of the plurality of phase lines, a received signal strength of each tone frequency of the plurality of tone frequencies of the signal; and based on the received signal strength of each tone frequency of the plurality of tone frequencies of the signal on each phase line of the plurality of phase lines, identifying, by the receiver, the transmitter as being coupled to the particular phase line of the plurality of phase lines.

2. The method of claim 1 wherein each feeder line comprises three phase lines of the plurality of phase lines.

3. The method of claim 1 wherein the transmitter is coupled to the particular phase line on a low-voltage side of a transformer, and the receiver is coupled to the plurality of phase lines on a high-voltage side of the transformer.

4. The method of claim 1 wherein identifying the transmitter as being coupled to the particular phase line of the plurality of phase lines based on the received signal strength of each tone frequency of the plurality of tone frequencies on each phase line of the plurality of phase lines further comprises:

determining an energy level associated with each tone frequency of the plurality of tone frequencies received on each phase line of the plurality of phase lines;

determining, for each tone frequency, a phase line of the plurality of phase lines that had a greatest energy level; and identifying the transmitter as being coupled to a phase line that has a largest number of tone frequencies with a greatest energy level.

5. The method of claim 1 further comprising:

receiving, by the receiver, an idle signal during an idle period when the signal is not being transmitted on each phase line of the plurality of phase lines;

determining an energy level associated with each tone frequency of the plurality of tone frequencies received on each phase line of the plurality of phase lines;

determining, for each phase line of the plurality of phase lines, an idle energy based at least in part on the idle signal;

for each respective phase line, subtracting, from the energy level determined for each tone frequency received on the respective phase line, the idle energy determined for the respective phase line to derive a net energy level for each tone frequency;

determining, for each tone frequency, a phase line of the plurality of phase lines that had a greatest net energy level; and identifying the transmitter as being coupled to a phase line that has a largest number of tone frequencies with a greatest net energy level.

6. The method of claim 5 wherein determining, for each phase line of the plurality of phase lines, the idle energy based at least in part on the idle signal comprises determining, for each respective phase line of the plurality of phase lines, and for each respective tone frequency, the idle energy of the idle signal at the respective tone frequency of the respective phase line.

7. The method of claim 6 wherein receiving, by the receiver, the idle signal during the idle period when the signal is not being transmitted on each phase line of the plurality of phase lines comprises:

receiving, by the receiver, a plurality of idle signals during a plurality of idle periods when the signal is not being transmitted on each phase line of the plurality of phase lines; and wherein determining, for each respective phase line of the plurality of phase lines, and for each respective tone frequency, the idle energy of the idle signal at the respective tone frequency of the respective phase line comprises determining an average idle energy for each respective tone frequency for each respective phase line by:

determining, for each respective phase line of the plurality of phase lines, and for each respective tone frequency, a plurality of idle energies of corresponding idle signals at the respective tone frequency of the respective phase line; and determining the average idle energy based on the plurality of idle energies.

8. The method of claim 1 wherein the plurality of tone frequencies are received in a predetermined sequence.

9. The method of claim 1 wherein the signal comprises a plurality of different frequencies in a range from about 1 kHz to about 4 kHz, the plurality of frequencies including the plurality of tone frequencies.

10. A receiver for determining a phase line on which a transmitter is transmitting, comprising:

a memory; and a processor coupled to the memory configured to:

receiving, by a receiver communicatively coupled to a plurality of power distribution phase lines, a signal on each phase line of the plurality of phase lines of a plurality of feeder lines due to crosstalk, each feeder line of the plurality of feeder lines comprising a subset of phase lines of the plurality of phase lines, the signal comprising a plurality of tone frequencies, and the signal being generated by a transmitter that transmits the signal on a particular phase line of the plurality of phase lines;

determining, by the receiver, for each respective phase line of the plurality of phase lines, a received signal strength of each tone frequency of the plurality of tone frequencies of the signal; and based on the received signal strength of each tone frequency of the plurality of tone frequencies of the signal on each phase line of the plurality of phase lines, identifying, by the receiver, the transmitter as being coupled to the particular phase line of the plurality of phase lines.

11. The receiver of claim 10 wherein each feeder line comprises three phase lines of the plurality of phase lines.

12. The receiver of claim 10 wherein the transmitter is coupled to the particular phase line on a low-voltage side of a transformer, and the receiver is coupled to the plurality of phase lines on a high-voltage side of the transformer.

13. The receiver of claim 10 wherein to identify the transmitter as being coupled to the particular phase line of the plurality of phase lines based on the received signal strength of each tone frequency of the plurality of tone frequencies on each phase line of the plurality of phase lines, the processor is further configured to:

determine an energy level associated with each tone frequency of the plurality of tone frequencies received on each phase line of the plurality of phase lines;

determine, for each tone frequency, a phase line of the plurality of phase lines that had a greatest energy level; and identify the transmitter as being coupled to a particular phase line that has a largest number of tone frequencies with a greatest energy level.

14. The receiver of claim 10, wherein the processor is further configured to:
  receive an idle signal during an idle period when the signal is not being transmitted on each phase line of the plurality of phase lines;
  determine an energy level associated with each tone frequency of the plurality of tone frequencies received on each phase line of the plurality of phase lines;
  determine, for each phase line of the plurality of phase lines, an idle energy based at least in part on the idle signal;
  for each respective phase line, subtract, from the energy level determined for each tone frequency received on the respective phase line, the idle energy determined for the respective phase line to derive a net energy level for each tone frequency;
  determine, for each tone frequency, a phase line of the plurality of phase lines that had a greatest net energy level; and
  identify the transmitter as being coupled to a phase line that has a largest number of tone frequencies with a greatest net energy level.

15. The receiver of claim 14 wherein to determine, for each phase line of the plurality of phase lines, the idle energy based at least in part on the idle signal, the processor is further configured to determine, for each respective phase line of the plurality of phase lines, and for each respective tone frequency, the idle energy of the idle signal at the respective tone frequency of the respective phase line.

16. The receiver of claim 15 wherein to receive the idle signal during the idle period when the sweep signal is not being transmitted on each phase line of the plurality of phase lines, the processor is further configured to:
  receive a plurality of idle signals during a plurality of idle periods when the sweep signal is not being transmitted on each phase line of the plurality of phase lines; and
  wherein to determine, for each respective phase line of the plurality of phase lines, and for each respective tone frequency, the idle energy of the idle signal at the respective tone frequency of the respective phase line, the processor is further configured to determine an average idle energy for each respective tone frequency for each respective phase line by being configured to:
    determine, for each respective phase line of the plurality of phase lines, and for each respective tone frequency, a plurality of idle energies of corresponding idle signals at the respective tone frequency of the respective phase line; and
    determine the average idle energy based on the plurality of idle energies.

17. The receiver of claim 10 wherein the plurality of tone frequencies is received in a predetermined sequence.

18. The receiver of claim 10 wherein the signal comprises a plurality of different frequencies in a range from about 1 kHz to about 4 kHz, the plurality of frequencies including the plurality of tone frequencies.

19. A method of determining a phase line on which a transmitter is transmitting, comprising:
  receiving, by a receiver communicatively coupled to a plurality of power distribution phase lines, a signal on each phase line of the plurality of phase lines due to crosstalk, the signal comprising a plurality of tone frequencies, and the signal being generated by a transmitter that directly transmits the signal on a first phase line of the plurality of phase lines;
  determining, by the receiver, for each respective phase line of the plurality of phase lines, a received signal strength of each tone frequency of the plurality of tone frequencies of the signal; and
  based on the received signal strength of each tone frequency of the plurality of tone frequencies of the signal on each phase line of the plurality of phase lines, identifying, by the receiver, the first phase line of the plurality of phase lines as being directly coupled to the transmitter.

* * * * *